United States Patent
Wang et al.

(10) Patent No.: US 8,772,148 B1
(45) Date of Patent: Jul. 8, 2014

(54) METAL GATE TRANSISTORS AND FABRICATION METHOD THEREOF

(71) Applicant: Semiconductor Manufacturing International (Shanghai) Corporation, Shanghai (CN)

(72) Inventors: Xinpeng Wang, Shanghai (CN); Qiyang He, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/030,026

(22) Filed: Sep. 18, 2013

(30) Foreign Application Priority Data

May 21, 2013 (CN) .......................... 2013 1 0190331

(51) Int. Cl.
*H01L 29/772* (2006.01)
(52) U.S. Cl.
USPC ........... 438/589; 438/585; 438/586; 438/289; 257/288; 257/E29.242; 257/E21.19

(58) Field of Classification Search
USPC .......... 438/589, 585, 586, 289; 257/E29.242, 257/E21.19
See application file for complete search history.

(56) References Cited

U.S. PATENT DOCUMENTS

2013/0309831 A1* 11/2013 Yin et al. ...................... 438/289
2014/0073125 A1* 3/2014 Kim et al. ..................... 438/589

* cited by examiner

*Primary Examiner* — Marc Armand
(74) *Attorney, Agent, or Firm* — Anova Law Group, PLLC

(57) ABSTRACT

A method is provided for fabricating a metal gate transistor. The method includes providing a semiconductor substrate; and forming a dielectric layer on the semiconductor substrate. The method also includes forming at least one dummy gate on the dielectric layer; and forming a first sidewall spacer around the dummy gate. Further, the method includes forming a gate dielectric layer with sidewalls protruding from sidewalls of the dummy gate and vertical to the semiconductor substrate by etching the dielectric layer using the first sidewall spacer and the dummy gate as an etching mask; and removing the dummy gate to form a trench. Further, the method also includes forming a metal gate in the trench; and forming a source region and a drain region in the semiconductor substrate.

13 Claims, 17 Drawing Sheets

METAL GATE TRANSISTORS AND FABRICATION METHOD THEREOF

CROSS-REFERENCES TO RELATED APPLICATIONS

This application claims the priority of Chinese patent application No. 201310190331.1, filed on May 21, 2013, the entirety of which is incorporated herein by reference.

FIELD OF THE INVENTION

The present invention generally relates to the field of semiconductor manufacturing technology and, more particularly, relates to metal gate transistors and fabrication techniques thereof.

BACKGROUND

With the development of semiconductor technology, poly silicon transistors may be unable to match the requirements of the small size semiconductor processes because of their large leakage current and high power consumption. Therefore, metal gate transistors have been developed.

FIG. 1 illustrates an existing metal gate transistor. The metal gate transistor includes a semiconductor substrate 1. A gate dielectric material layer, a work function material layer and a dummy gate material layer may be sequentially formed on the semiconductor substrate 1. After an etching process, a gate dielectric layer 2, a work function layer 3, and a dummy gate 4 may be formed. The gate dielectric layer 2, the work function layer 3, and the dummy gate 4 may form a stack structure 5. Further, sidewalls of the gate dielectric layer 2, the work function layer 3, and the dummy gate 4 may be on a same plane. A source region (not shown) and a drain region (not shown) may be formed in the semiconductor substrate 1 at both sides of the stack structure 5 by an ion implantation process, followed by an thermal annealing process.

However, it may have a plurality of high temperature processes for fabricating the existing metal gate transistor. For example, the temperature of an ion implantation process and a rapid thermal annealing process, etc., may all be greater than 300° C. The high temperature processes may cause the gate dielectric layer 2 and the work function layer 3 to shrink, thus widths of the dielectric gate layer 2 and the work function layer 3 may be smaller than a width of the dummy gate 4 along a first direction, i.e., a direction parallel to the direction from the source region to the drain region. Therefore, when the dummy gate 4 is removed to subsequently form a metal gate, a width of the metal gate may be greater than the width of the gate dielectric layer 2 and the width of the work function layer 3, and a length of the metal gate may be greater than a length of the gate dielectric layer 2 and a length of the work function layer 3, the performance of the transistor may be affected.

In order to solve the above mentioned shrinking problem, a metal gate structure has been developed. As shown in FIG. 2, by controlling the parameters of the etching process of the dummy gate material layer, the gate dielectric material layer and the work function layer, a sidewall 21 of the gate dielectric layer 2 may protrude from a sidewall 31 of the work function layer 3 and a sidewall 41 of the dummy gate 4 after the etching process of the stack 5. Further, the sidewall 21 of the gate dielectric layer 2 may be sloping, i.e., the sidewall 21 of the gate dielectric layer 2 may be not perpendicular to the surface S of the substrate 1.

FIG. 3 illustrates another metal gate structure to solve the above mentioned shrinking problem. As shown in FIG. 3, by controlling the parameters of the etching process of the dummy gate material layer, the gate dielectric material layer and the work function layer, a sidewall 21 of the gate dielectric layer 2 and a sidewall 31 of the work function layer 3 may both protrude from a sidewall 41 of the dummy gate 4 after the etching process of the stack structure 5. Further, the sidewall 21 of the gate dielectric layer 2 and the sidewall 31 of the work function layer 3 may be sloping, i.e., the sidewall 21 of the gate dielectric layer 2 and the sidewall 31 of the work function layer 3 may be not perpendicular to the surface S of the substrate 1.

Because the protruding parts of the sidewall 21 of the dielectric layer 2 and the sidewall 31 of the work function layer 3 may compensate shrinkages caused by subsequent processes, the widths of the dielectric layer 3 and the work function layer 3 may be no longer smaller than the width of the metal gate after the gate dielectric layer 2 and the work function layer 3 after shrink, and the lengths of the dielectric layer 3 and the work function layer 3 may not be smaller than the length of the metal gate. Thus, the performance of the transistor may be enhanced.

However, the above mentioned devices and methods may have certain disadvantages, and may expose the etching processes to challenges. For example, it may be significantly difficult and complex to control the etching processes to cause the gate dielectric layer 2 and the work function layer 3 to protrude outwardly. Further, it may also be difficult to control amount of the protruding. The disclosed methods and devices are directed to solve one or more problems set forth above and other problems.

BRIEF SUMMARY OF THE DISCLOSURE

One aspect of the present disclosure includes a method for fabricating a metal gate transistor. The method includes providing a semiconductor substrate; and forming a dielectric layer on the semiconductor substrate. The method also includes forming at least one dummy gate on the dielectric layer; and forming a first sidewall spacer around the dummy gate. Further, the method includes forming a gate dielectric layer with sidewalls protruding from sidewalls of the dummy gate and vertical to the semiconductor substrate by etching the dielectric layer using the first sidewall spacer and the dummy gate as an etching mask; and removing the dummy gate to form a trench. Further, the method also includes forming a metal gate in the trench; and forming a source region and a drain region in the semiconductor substrate.

Another aspect of the present disclosure includes a metal gate transistor. The metal gate transistor includes a semiconductor substrate and a gate dielectric layer on the semiconductor substrate. The metal gate transistor also includes a metal gate on the gate dielectric layer, and the gate dielectric layer protruding from the metal gate. Further, the metal gate transistor includes a first sidewall spacer around the metal gate and an interlayer dielectric layer on the semiconductor substrate. Further, the metal gate transistor also includes a source region and a drain region in the semiconductor substrate Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
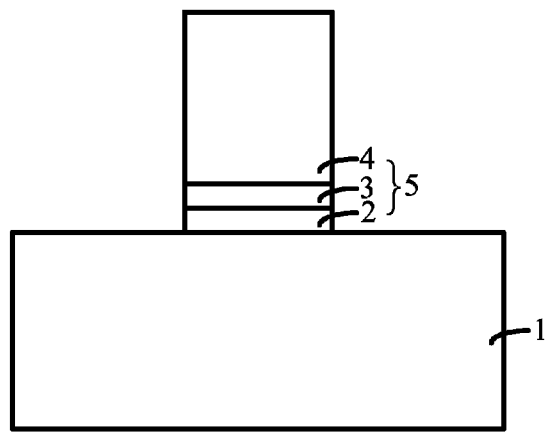
FIG. 1 illustrates an existing metal gate transistor.
Figure 2:
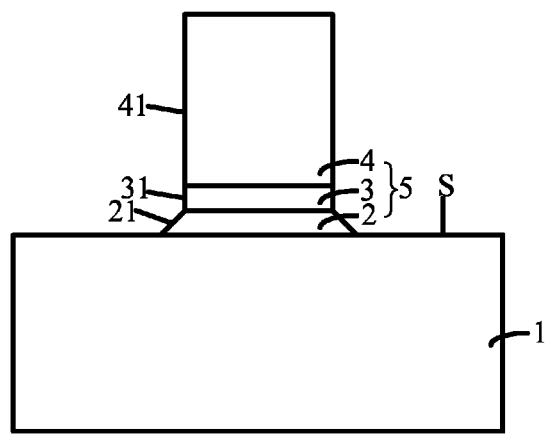
FIG. 2 illustrates another existing metal gate transistor.
Figure 3:
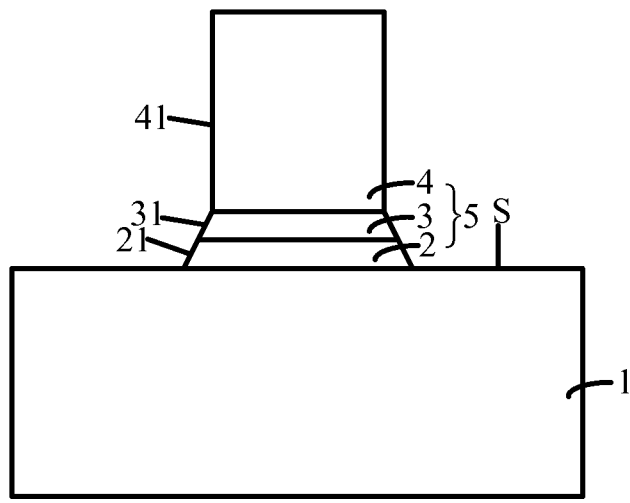
FIG. 3 illustrates another existing metal gate transistor.
Figure 4:
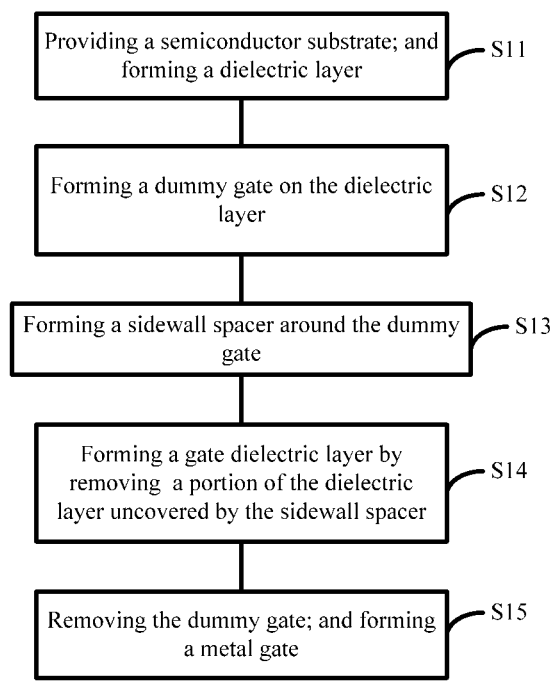
FIG. 4 illustrates an exemplary fabrication process of a metal gate transistor consistent with the disclosed embodiments

FIG. 4 illustrates an exemplary fabrication process of a metal gate transistor consistent with the disclosed embodiments; and FIGS. 5-9 illustrate semiconductor structures corresponding to certain stages of the exemplary fabrication process of a metal gate transistor consistent with the disclosed embodiments.

As shown in FIG. 4, at the beginning of the fabrication process, a semiconductor substrate with certain structures is provided (S11). A corresponding semiconductor device is shown in FIG. 5.

Figure 5:
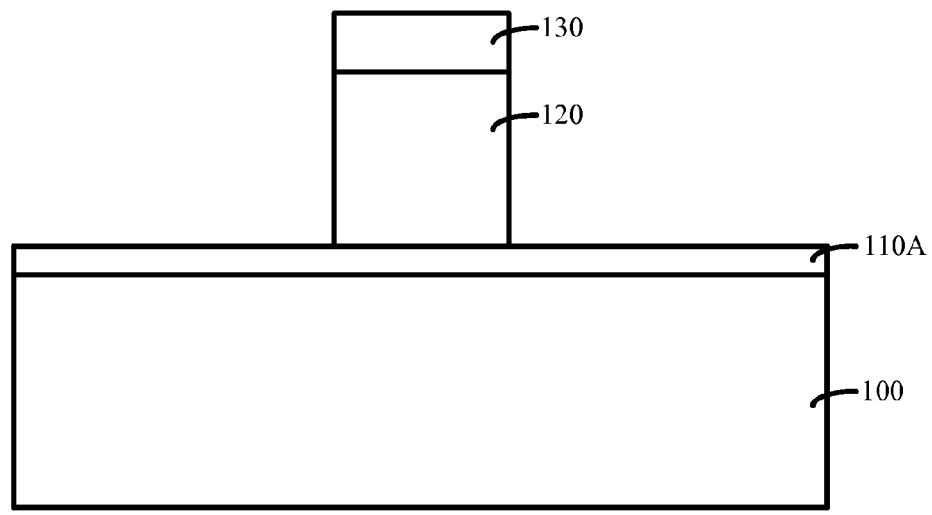
FIGS. 5-9 illustrate semiconductor structures corresponding to certain stages of the exemplary fabrication process of a metal gate transistor consistent with the disclosed embodiments.

As shown in FIG. 5, a semiconductor substrate 100 is provided. The semiconductor substrate 100 may include any appropriate type of semiconductor material, such as single crystal silicon, germanium, poly silicon, amorphous silicon, silicon germanium, carborundum, indium antimonide, lead telluride, indium arsenide, indium phosphide, gallium arsenide, gallium antimonide, alloy semiconductor, or epitaxially grown materials, etc. The semiconductor substrate 100 may also provide a base for subsequent processes and structures.

After providing the semiconductor substrate 100, a dielectric layer 110A may be formed on the semiconductor substrate 100. The dielectric layer 110A may be made of any appropriate material, such as hafnium silicate, zirconium silicate, hafnium dioxide, or zirconium dioxide, etc. These material may be referred as high dielectric (high-K) materials, thus the dielectric layer 110A may be referred as high-K dielectric layer. Various processes may be used to form the dielectric layer 110A, such as a chemical vapor deposition (CVD) process, a physical vapor deposition (PVD) process, or an atomic layer deposition (ALD) process, etc.

In certain other embodiments, an interface layer may be formed between the semiconductor substrate 100 and the dielectric layer 110A. The interface layer may be used to compensate interface defects between the semiconductor substrate 100 and the dielectric layer 110A. The interface layer may be made of any appropriate material, such as silicon oxide, silicon nitride, or silicon oxynitride, etc. Various processes may be used to form the interface layer, such as a CVD process, a PVD process, or an ALD process, etc.

Returning to FIG. 4, after providing the semiconductor substrate 100 with the dielectric layer 110A, a dummy gate may be formed on the dielectric layer 110A (S12). A corresponding semiconductor is shown in FIG. 5.

As shown in FIG. 5, a dummy gate 120 is formed on the dielectric layer 110A. The dummy gate 120 may be used to define the position of a metal gate of a transistor. The dummy gate 120 may be removed in a subsequent process to form a metal gate. In one embodiment, a hard mask layer 130 may be formed on the dummy gate 120.

The dummy gate 120 and the hard mask layer 130 may be formed by sequentially depositing a dummy gate material layer, a hard mask material layer and a photoresist layer; patterning the photoresist layer; and etching the dummy gate material layer and the hard mask material layer using the photoresist layer as an etching mask. After forming the dummy gate 120 and the mask layer 130, the photoresist layer may be removed.

The dummy gate 120 may be made of any appropriate material, such as poly silicon, phosphor-silicate-glass (PSG), or metal materials, etc. In one embodiment, the dummy gate 120 is poly silicon. Various processes may be used to form the dummy gate material layer, such as a CVD process, a PVD process, or an ALD process, etc.

The hard mask layer 130 may be made of any appropriate material, such as silicon oxide, silicon nitride, or silicon oxide nitride, etc. In one embodiment, the hard mask layer 130 is made of silicon nitride. Various processes may be used to form the hard mask material layer, such as a CVD process, a PVD process, or an ALD process, etc.

The hard mask material layer and the dummy gate material layer may be etched by any appropriate process, such as a dry etching process, or a wet etching process, etc. In one embodiment, the hard mask material layer and the dummy gate material layer are etched by a dry etching process.

Figure 6:
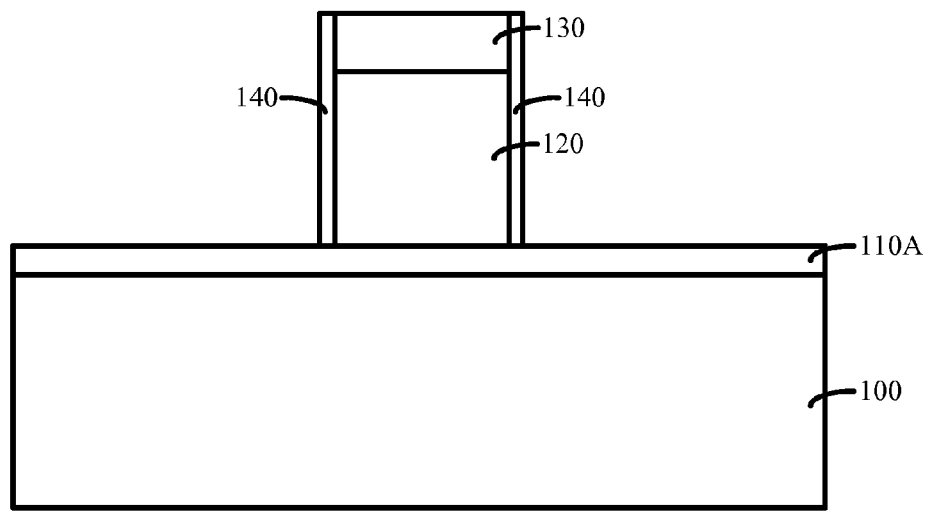

Returning to FIG. 4, after forming the dummy gate 120 and the hard mask layer 130, a first sidewall spacer may be formed (S13). FIG. 6 illustrate a corresponding semiconductor structure.

As shown in FIG. 6, a first sidewall spacer 140 is formed around the dummy gate 120. In one embodiment, the first sidewall spacer 140 may also cover the side surface of the hard mask layer 130. The first sidewall spacer 140 may be formed by forming a first sidewall spacer material layer on the dielectric layer 110A and the top and side surfaces of the dummy gate 120 and the hard mask layer 130, followed by an etch back process. After the etch back process, the first sidewall spacer material layer on the dielectric layer 110A and the top surface of the hard mask layer 130 may be completely removed, the first sidewall spacer 140 is formed around the dummy gate 120 and the hard mask layer 130.

The first sidewall spacer material layer may be made of any appropriate material silicon oxide, silicon nitride, or silicon nitride, etc. The first sidewall spacer 140 may also be a stack layer consisting two or more layers of different material.

Various processes may be used to form the first sidewall spacer material layer, such as a CVD process, a PVD process, an ALD process, or a flowable CVD (FCVD) process, etc. In one embodiment, the first sidewall spacer material layer is formed by an ALD process. The ALD process may cause the first sidewall spacer material layer to have a relatively good step-covering ability, and a thickness of the first sidewall spacer material layer may be uniform. A thickness of the first sidewall spacer material layer may be in a range of approximately 1 Å~50 Å.

During a process for forming the first sidewall spacer 140, the hard mask layer 130 may be used to prevent the dummy gate 120 from being etched. During an etching process of the first sidewall spacer 140, the first sidewall spacer material layer and the hard mask layer 130 should have a relatively high etching selectivity ratio, and the first sidewall spacer material and the dielectric layer 110A should also have a relatively high etching selectivity ratio.

Various processes may be used to etch the first sidewall spacer material layer, such as a dry etching process, or a wet etching process, etc. In one embodiment, if the first sidewall spacer material layer is silicon oxide, the hard mask layer is silicon nitride, and a dry etching process may be used to form the first sidewall spacer 140. Main gas for the dry etching process may be one or more of $CH_3F$, $CHF_3$, and $CH_2F_2$, etc. Assisting gas for the dry etching process may be one or more of Ar, $O_2$, and He, etc.

Figure 7:
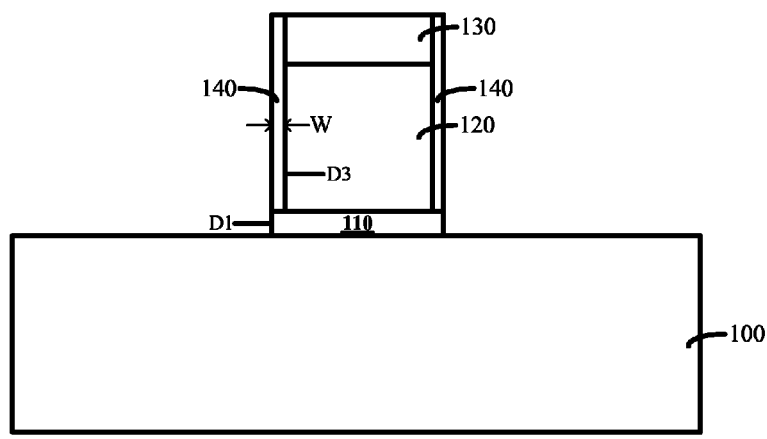

Returning to FIG. 4, after forming the first sidewall spacer 140, a portion of the dielectric layer 110A may be removed to form a gate dielectric layer (S14). FIG. 7 illustrates a corresponding semiconductor structure.

As shown in FIG. 7, a portion of the dielectric layer 110A exposed by the sidewall spacer 140 and the dummy gate 120, i.e., not covered by the sidewall spacer 140 and the dummy gate 120, is removed, and a gate dielectric layer 110 is formed. Various methods may be used to form the gate dielectric layer 110. In one embodiment, the gate dielectric layer 110 is formed by etching the portion of the dielectric layer 110A using the first sidewall spacer 140 and the dummy gate 120 as an etching mask.

Various processes may be used to etch and remove the portion of the dielectric layer 110A, such as a dry etching process, or a wet etching process, etc. In one embodiment, a dry etching process is used to etch the dielectric layer 110A to form the gate dielectric layer 110. As shown in FIG. 7, if a dry etching process is used, the sidewall "D1" of the gate dielectric layer 110 may be upright, i.e., the sidewall "D1" of the gate dielectric layer 110 is vertical to the surface of the semiconductor substrate 100.

Since the gate dielectric layer 110 may be formed by using the dummy gate 120 and the first sidewall spacer 140 around the dummy gate 120 as an etching mask, the sidewall "D1" of the gate dielectric layer 110 may protrude from the sidewall "D3" of the dummy gate 120. A protruding amount "W" of the gate dielectric layer 110, i.e., a distance of the gate dielectric layer 110 protruding from the dummy gate 120, may be equal to the thickness of the first sidewall spacer 140, i.e., a thickness of the first sidewall spacer material layer. Therefore, the protruding amount of the gate dielectric layer 110 may be merely controlled by the thickness of the first sidewall spacer material layer.

Further, the first sidewall spacer 140 may be formed on the sidewall of the dummy gate 120 and the sidewall 140 may surround the dummy gate 120. The dummy gate 120 and the sidewall spacer 140 may be used as an etching mask to etch the dielectric layer 110A, and the sidewall D1 of the dielectric layer 110 may protrude from the sidewall D3 of the dummy gate 120 after the etching process. It may unnecessarily need complex processes to cause the sidewall "D1" of the dielectric layer 110 to protrude from the sidewall "D3" of the dummy gate 120, thus it may be easily to form the protruding structure by using the present process.

The hard mask layer 130 may be used to prevent the dummy gate 120 from being damaged during the etching process.

Figure 8:
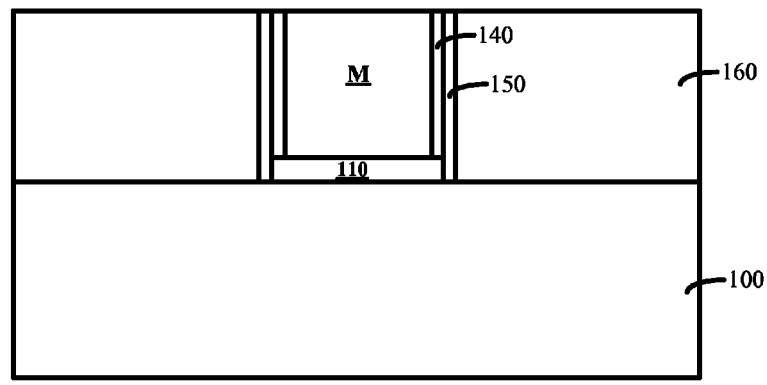
Figure 9:
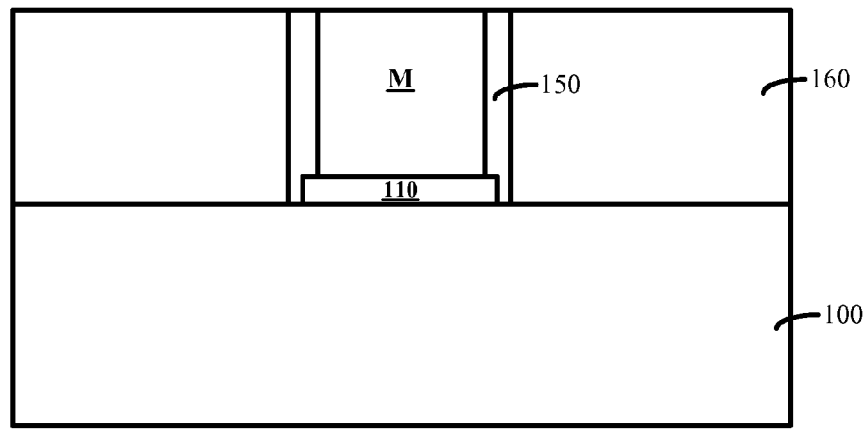

Returning to FIG. 4, after forming the dielectric layer 110, the dummy gate 120 may be removed, and a metal gate may be formed at the position of the dummy gate (S15). FIGS. 8-9 illustrate corresponding semiconductor structures.

As shown in FIG. 8, in one embodiment, the dummy gate 120 and the hard mask layer 130 are removed, a sidewall spacer 150 is formed around the first sidewall spacer 140, an interlayer dielectric layer 160 is formed on the semiconductor substrate 100, and a metal gate "M" is formed at the position of the dummy gate 120. Specifically, A process for forming the metal gate "M" may include: forming the sidewall spacer 150 around the first sidewall spacer 140; forming an interlayer dielectric layer 160; performing a planarization process on the interlayer dielectric layer 160 by a chemical mechanical polishing (CMP) process and removing the hard mask layer 130 to expose the dummy gate 120; removing the dummy gate 120 to form a trench; filling the trench with metal material; and polishing extra metal material using a CMP process to forming the metal gate "M" at the position of the dummy gate 120.

As shown in FIG. 9, in certain other embodiments, the dummy gate 120, the first sidewall spacer 130 and the hard mask layer 130 are removed; an interlayer dielectric layer 160 is formed on the semiconductor substrate 100; a metal gate "M" is formed at the position of the dummy gate 120; and a sidewall spacer 150 is formed around the metal gate "M". Specifically, a process for forming the metal gate "M" may include: removing the sidewall spacer 140; forming the sidewall spacer 150 around the dummy gate 120 and the hard mask layer 130; forming the interlayer dielectric layer 160 on the semiconductor substrate 100; removing the hard mask layer 130 and the dummy gate 120 to form a trench; filling the trench with a metal material; and polishing extra metal material to form the metal gate "M".

The hard mask layer 130 and the dummy gate 120 may be removed by any appropriate process, such as a dry etching process, or a wet etching process, etc. The metal gate "M" may be formed by any appropriate process, such as a PVD process, an FCVD process, or an electroplating process, etc. The metal gate "M" may be made of any appropriate metal, such as Cu, W, Al, gold, or Ti, etc.

As mentioned early, there may be a few high temperature processes after forming a gate dielectric layer. The high temperature processes may cause the gate dielectric layer to shrink. A width of the gate dielectric layer may be smaller than a width of the dummy gate. A length of the gate dielectric layer may be smaller than a length of the dummy gate as well. Thus, after removing the dummy gate and forming a metal gate, a width of the metal gate may be greater than the width of the gate dielectric layer, and a length of the metal gate may be greater than the length of the gate dielectric layer as well. In one embodiment, the sidewall "D1" of the gate dielectric layer 110 may protrude from the sidewall "D3" of the dummy gate 120, thus the shrinkage of the gate dielectric layer 110 caused by subsequent processes may be compensated by a sidewall protruding part of the gate dielectric layer 110. By controlling the protruding amount of the gate dielectric layer 110, the width of the gate dielectric layer 110 after shrinking may still not smaller than the width of the metal gate "M" after the high temperature processes. That is, after the gate dielectric layer 110 shrink, the sidewall "D1" of the gate dielectric layer 110 may still protrude from the sidewall of the metal gate "M", and/or the sidewall "D1" of the gate dielectric layer 110 and the sidewall of the metal gate "M" may be on a same plane. Thus, it may prevent the width of the metal gate "M" from being greater than the width of the gate dielectric layer 110.

Further, the length of the gate dielectric layer 110 after shrinking may not be smaller than the length of the metal gate "M". That is, after the gate dielectric layer 100 shrinks, the sidewall "D1" of the gate dielectric layer 110 may still protrude from the sidewall of the metal gate "M", and/or the sidewall "D1" of the gate dielectric layer 110 and the sidewall of the metal gate "M" may be on a same plane. Thus, it may prevent the length of the metal gate "M" from being greater than the length of the gate dielectric layer 110, and the performance of the transistor may be improved.

In one embodiment, one of the functions of the hard mask layer 130 may be to protect the dummy gate 120 during the etching process. In certain other embodiments, it may unnecessary to have the hard mask layer 130 on the dummy gate 120.

Therefore, in the present method, a dummy gate may be firstly formed on a dielectric layer, and then a first sidewall spacer may be formed around the dummy gate. Further, a portion of the dielectric layer exposed by the dummy gate and the first sidewall spacer may be removed using the dummy gate and the first sidewall spacer as an etching mask to form a gate dielectric layer, and the gate dielectric may protrude from sidewalls of the dummy gate. Since an amount of the gate dielectric layer protruding from the dummy gate may be equal to a thickness of the first sidewall spacer, thus the amount of the dielectric layer protruding from the dummy gate may be controlled by adjusting the thickness of the first sidewall spacer.

After forming the metal gate, a source region (not shown) and a drain region (not shown) may be formed in the semiconductor substrate 100 at both sides of the sidewall spacer 150. In certain other embodiments, the source region and the drain region may be formed after forming the gate dielectric layer. Any appropriate process may be used to formed the source region and the drain region.

Thus, a metal gate transistor may be formed by the above disclosed processes and methods. The corresponding metal gate transistor is illustrated in FIG. 8. The metal gate transistor includes a semiconductor substrate 100 and an interlayer dielectric layer 160. The metal gate transistor also includes a metal gate "M" and a gate dielectric layer 110 protruding from the metal gate "M". Further, the metal gate transistor includes a first sidewall spacer 140 and a sidewall spacer 150. Further, the metal gate transistor also includes a source region (not shown) and a drain region (not shown). The detailed structures and intermediate structures are described above with respect to the fabrication methods.

The exemplary process shown in FIG. 4 may also be used to form multiple size metal gate transistors on a same substrate; and FIGS. 10-16 illustrate semiconductor structures corresponding to certain stages of the exemplary fabrication process of multiple size metal gate transistors on a same substrate consistent with the disclosed embodiments;

As shown in FIG. 4, at the beginning of the fabrication process, a semiconductor substrate with certain structures is provided (S11). A corresponding semiconductor device is illustrated in FIG. 10.

Figure 10:
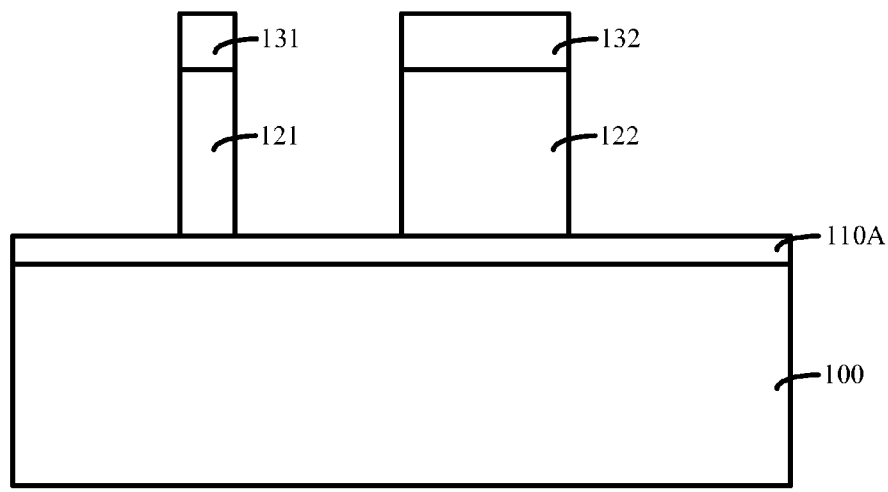
FIGS. 10-16 illustrate semiconductor structures corresponding to certain stages of the exemplary fabrication process of multi size metal gate transistors on a same substrate consistent with the disclosed embodiments.

As shown in FIG. 10, a semiconductor substrate 100 is provided. The semiconductor substrate 100 may include any appropriate type of semiconductor material, such as single crystal silicon, germanium, poly silicon, amorphous silicon, silicon germanium, carborundum, indium antimonide, lead telluride, indium arsenide, indium phosphide, gallium arsenide, gallium antimonide, alloy semiconductor, or epitaxially grown materials, etc. The semiconductor substrate 100 may also provide a base for subsequent processes and structures.

After providing the semiconductor substrate 100, a dielectric layer 110A may be formed on the semiconductor substrate 100. The dielectric layer 110A may be made of any appropriate material, such as hafnium silicate, zirconium silicate, hafnium dioxide, or zirconium dioxide, etc. These material may be referred as high dielectric (high-K) materials, thus the dielectric layer 110A may be referred as a high-K dielectric layer. Various processes may be used to form the dielectric layer 110A, such as a chemical vapor deposition (CVD) process, a physical vapor deposition (PVD) process, or an atomic layer deposition (ALD) process, etc.

In certain other embodiments, an interface layer may formed between the semiconductor substrate 100 and the dielectric layer 110A. The interface layer may be used to compensate interface defects between the semiconductor substrate 100 and the dielectric layer 110A. The interface layer may be made of any appropriate material, such as silicon oxide, silicon nitride, or silicon oxynitride, etc. Various processes may be used to form the interface layer, such as a CVD process, a PVD process, or an ALD process, etc.

Returning to FIG. 4, after providing the semiconductor substrate 100 with the dielectric layer 110A, a plurality of dummy gates may be formed on the dielectric layer 110A (S12). For illustrative purposes, two dummy gates are formed on the semiconductor substrate 100. A corresponding semiconductor is illustrated in FIG. 10.

As shown in FIG. 10, a first dummy gate 121 and a second dummy gate 122 are formed on the dielectric layer 110A. The first dummy gate 121 and the second dummy gate 122 may be used to define the position of metal gates of transistors. The first dummy gate 121 and the second dummy gate 122 may be removed in a subsequent process to form metal gates.

A length of the first dummy gate 121 may be smaller than a length of the second dummy gate 122 along a first direction, i.e., a direction vertical to a direction from a source region to a drain region; and/or a width of the first dummy gate 121 may be smaller than a width of the second dummy gate 122 along a second direction, i.e., a direction parallel to a direction from a source region to a drain region. In one embodiment, for illustrative purposes, the width of the first dummy gate 121 is smaller than the width of the second dummy gate 122.

Optionally and additionally, a first hard mask layer 131 may be formed on the first dummy gate 121; and a second hard mask layer 132 may be formed on the second dummy gate 122.

Figure 11:
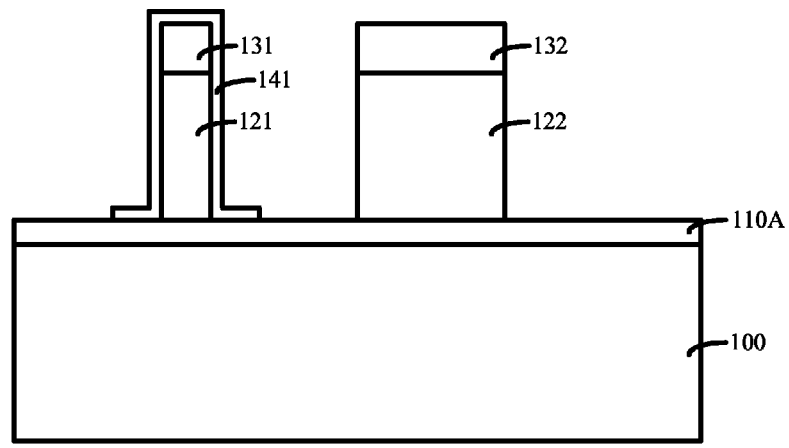
Figure 12:
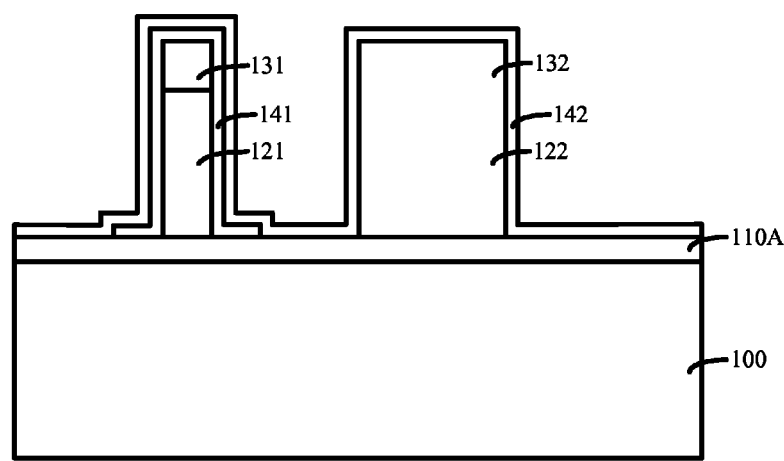
Figure 13:
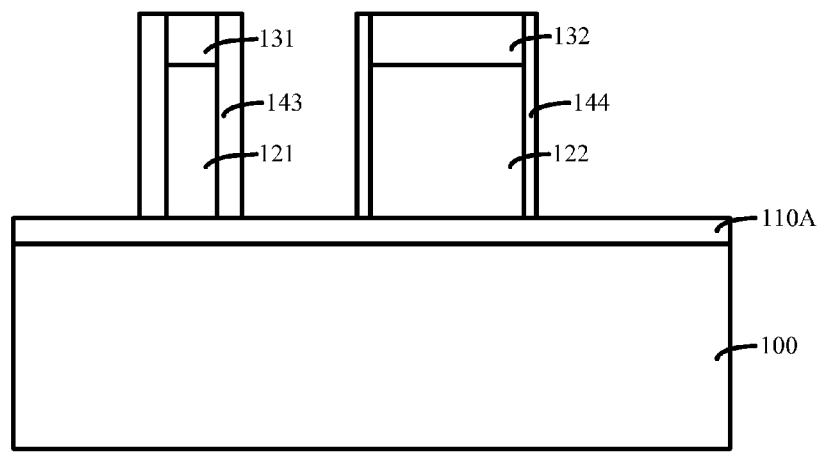

Returning to FIG. 4, after forming the first dummy gate 121 with the first hard mask layer 131 and the second dummy gate 122 with the second hard mask layer 132, a first sidewall spacer and a second sidewall spacer may be formed (S13). FIGS. 11-13 illustrate corresponding semiconductor structures.

As shown in FIG. 11, a first sidewall spacer material layer 141 is formed around the dummy gate 121 and the first hard mask layer 131. The first sidewall material layer 141 may be formed by: depositing a first material layer (not shown) on the semiconductor substrate 100, the first dummy gate 121, the first hard mask layer, 131, the second dummy gate 122 and the second hard mask layer 132; forming a patterned photoresist layer to cover the top and sidewalls of the first material layer; and removing the first material layer exposed by the photoresist layer to form the first sidewall spacer material layer 141.

Further, as shown in FIG. 12, after forming the first sidewall spacer material layer 141, a second sidewall spacer material layer 142 may be formed on the first sidewall spacer material layer 141, the surface of the semiconductor substrate 100, and the sidewalls of the second dummy gate 122 and the second hard mask layer 132; and the top surface of the second hard mask layer 132.

Further, after forming the second sidewall spacer material layer 142, an etch back process may be performed to remove the first sidewall spacer material layer 141 on the top surface of the first hard mask layer 131 and the surface of the semiconductor substrate 100. The second sidewall spacer material layer 142 on the surface of the semiconductor 100 and the top surface of the second hard mask layer 132 may also be removed. Thus, as shown in FIG. 13, a first sidewall spacer 143 is formed around the first dummy gate 121 and the first hard mask layer 131, and a second sidewall spacer 144 is formed around the second dummy gate 122 and the second hard mask layer 132. A thickness of the first sidewall spacer 143 may be greater than a thickness of the second sidewall spacer 144 because the first sidewall spacer 143 may be formed by both the first sidewall spacer material layer 141 and the second sidewall spacer material layer 142; and the second sidewall spacer 144 may be formed by only the second sidewall spacer material layer 142.

In one embodiment, if the first hard mask layer 131 and the second hard mask layer 132 are omitted, the first sidewall spacer 143 may cover the sidewall of the first dummy gate 121 after the etch back process. The second sidewall spacer 144 may cover the sidewall of the second dummy gate 122.

The first sidewall spacer material layer and the second sidewall spacer material layer may be made of any appropriate material, such as silicon oxide, silicon nitride, or silicon nitride, etc. In one embodiment, the first sidewall spacer 143 and the second sidewall spacer 144 are made of silicon oxide. The first sidewall spacer 143 and the second sidewall spacer 144 may also be stacked layers consisting two or more layers of different material.

Various processes may be used to form the first sidewall spacer material layer and the second sidewall spacer material layer, such as a CVD process, a PVD process, an ALD process, or a flowable CVD (FCVD) process, etc. In one embodiment, the first sidewall spacer material layer is formed by an ALD process. The ALD process may cause the first sidewall spacer material layer to have a relatively good step-covering ability, and a thickness of the first sidewall spacer material layer may be uniform. A thickness of the first sidewall spacer material layer may be in a range of approximately 1 Å~50 Å. A thickness of the second sidewall spacer material layer may also be in a range of approximately 1 Å~50 Å.

Various processes may be used to etch the first sidewall spacer material layer and the second sidewall spacer material layer, such as a dry etching process, or a wet etching process, etc. In one embodiment, if the first sidewall spacer material layer is silicon oxide, the hard mask layer is silicon nitride, a dry etching process may be used. Main gas for the dry etching process may be one or more of $CH_3F$, $CHF_3$, and $CH_2F_2$, etc. Assisting gas for the dry etching process may be one or more of Ar, $O_2$, and He, etc.

Figure 14:
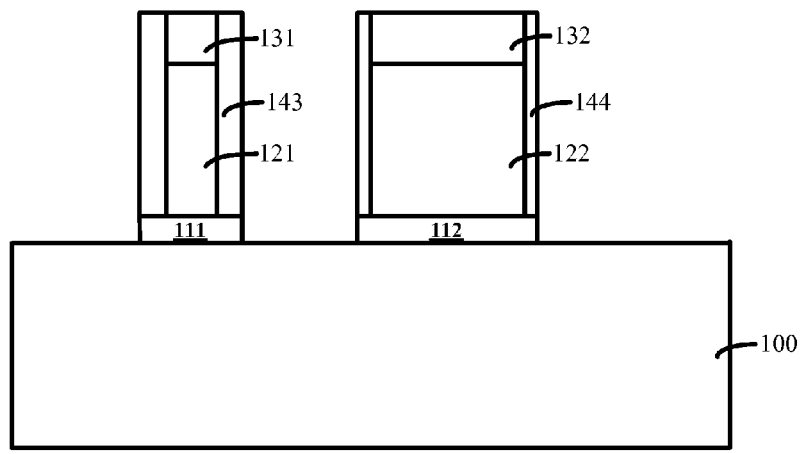

Returning to FIG. 4, after forming the first sidewall spacer 143 and the second sidewall spacer 144, a portion of the dielectric layer 110A may be removed to form gate dielectric layers (S14). FIG. 14 illustrates a corresponding semiconductor structure.

As shown in FIG. 14, a portion of the dielectric layer 110A exposed by the first sidewall spacer 143 and the second sidewall spacer 144, i.e., not covered by the sidewall spacer 140 and the dummy gate 120, is removed, a first gate dielectric layer 111 under the first dummy gate 121 and the first sidewall spacer 143 is formed, and a second gate dielectric layer 112 under the second dummy gate 122 and the second sidewall spacer 144 is also formed.

Since the thickness of the first sidewall spacer 143 may be greater than the second sidewall spacer 144, a protruding amount of the sidewall of the first gate dielectric layer 111 may be equal to the thickness of the first sidewall spacer 143, and a protruding amount of the sidewall of the second gate dielectric layer 112 may equal to the thickness of the second sidewall spacer 144, the protruding amount of the sidewall of the first gate dielectric layer 111 may be greater than the protruding amount of the sidewall of the second gate dielectric layer 112.

Various processes may be used to etch and remove the portion of the dielectric layer 110A, such as a dry etching process, or a wet etching process, etc. In one embodiment, a dry etching process is used to etch the dielectric layer 110A to form the first gate dielectric layer 111 and the second gate dielectric layer 112.

The protruding amount of the sidewall of the first gate dielectric layer 111 may be equal to the thickness of the first sidewall spacer 144, the thickness of the first sidewall spacer 142 may be controlled by adjusting a total thickness of the first sidewall spacer material layer 141 and the second sidewall spacer material layer 142, thus the protruding amount of the sidewall of the first gate dielectric layer 111 may be controlled by adjusting the total thickness of the first sidewall material layer 141 and the second sidewall spacer material layer 142. The protruding amount of the sidewall of the second gate dielectric layer 112 may be controlled by adjusting the thickness of the second sidewall spacer material layer 142.

Figure 15:
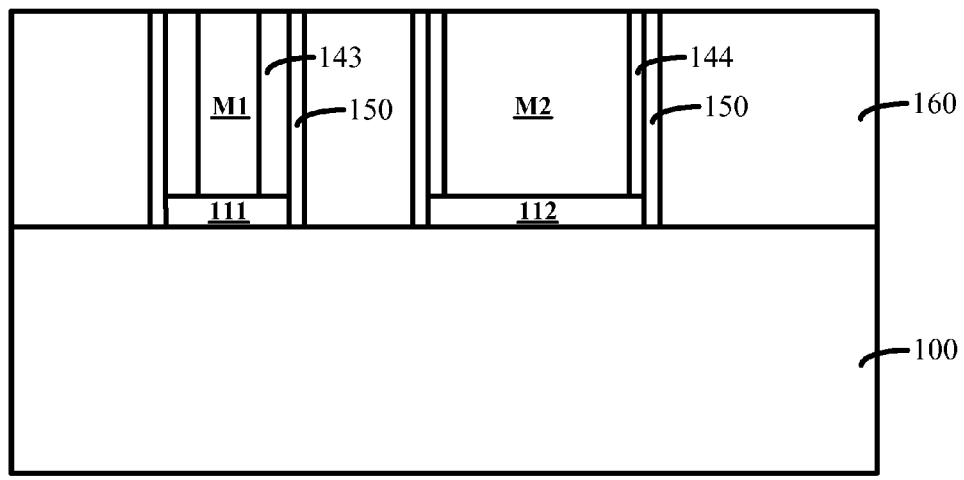

Returning to FIG. 4, after forming the first gate dielectric layer 111 and the second gate dielectric layer 112, the first dummy gate 121 and the second dummy gate 122 may be removed, and metal gates may be formed in the positions of the first dummy gate 121 and the second dummy gate 122 (S15). FIGS. 14-15 illustrate corresponding semiconductor structures.

As shown in FIG. 14, in one embodiment, the first dummy gate 121, the first hard mask layer 131, the second dummy gate 122 and the second hard mask layer 132 are removed, a sidewall spacer 150 is formed around the first sidewall spacer 143 and the second sidewall spacer 144, an interlayer dielectric layer 160 is formed on the semiconductor substrate 100. Further, a first metal gate "M1" is formed at the position of the first dummy gate 121, and a second metal gate "M2" is formed at the position of the second dummy gate 122.

Specifically, a process for forming the first metal gate "M1" and the second metal gate "M2" may include: forming the sidewall spacer 150 around the first sidewall spacer 143 and the second sidewall spacer 144; forming an interlayer dielectric layer 160; performing a planarization on the interlayer dielectric layer 160 by a chemical mechanical polishing (CMP) process and removing the first hard mask layer 131 and the second hard mask layer 132 to expose the first dummy gate 121 and the second dummy gate 122; removing the first dummy gate 121 and the second dummy gate 122 to form trenches; filling the trenches with a metal material; and polishing extra metal material using a CMP process to form the first metal gate "M1" at the position of the first dummy gate 121 and the second metal gate "M2" at the position of the second dummy gate 122.

Figure 16:
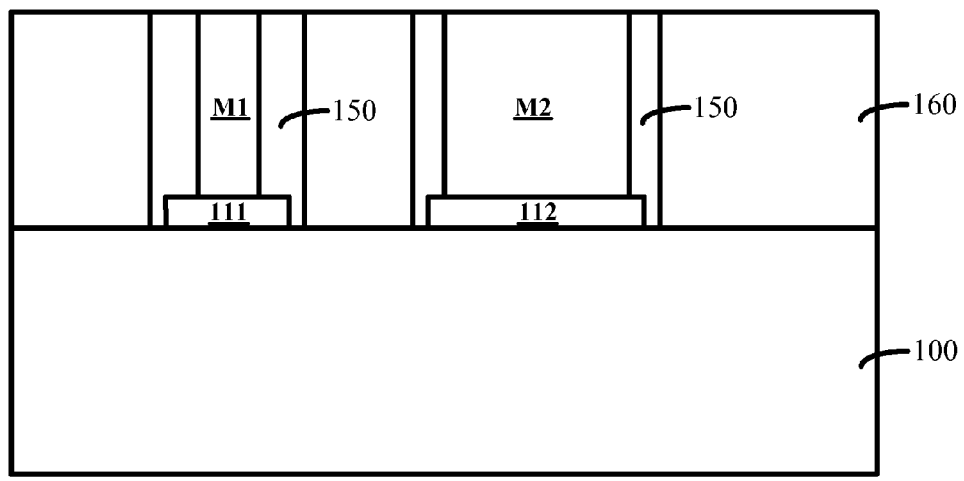

As shown in FIG. 16, in certain other embodiments, the first dummy gate 121, the first sidewall spacer 143, the first hard mask layer 131, the second dummy gate 122, the second sidewall spacer 144 and the second hard mask layer 132 are removed; an interlayer dielectric layer 160 is formed on the semiconductor substrate 100; a first metal gate "M1" is formed at the position of the first dummy gate 121; a second metal gate "M2" is formed at the position of the second dummy gate 122; and a sidewall spacer 150 is formed around the first metal gate "M1" and the second metal gate "M2".

Specifically, a process for forming the first metal gate "M1" and the second metal gate "M2" may include: removing the first sidewall spacer 143 and the second sidewall spacer 144; forming the sidewall spacer 150 around the first dummy gate 121 the first hard mask layer 131, the second dummy gate 122 and the second hard mask layer 132; forming the interlayer dielectric layer 160 on the semiconductor substrate 100; removing the hard mask layer 131, the first dummy gate 121, the second hard mask layer 132 and the second dummy gate 122 to form trenches; filling the trenches with a metal material; and polishing extra metal material to form the first metal gate "M1" and the second metal "M2".

After forming the first metal gate "M1" and the second metal gate "M2", source regions (not shown) and drain regions (not shown) may be formed in the semiconductor substrate 100, metal gate transistors with different sizes may be formed. The source regions and the drain regions may be formed by any appropriate process.

Thus, metal gate transistors with different sizes may be formed by the above disclosed processes and methods, the corresponding metal gate transistors are illustrated in FIG. 16. The metal gate transistors include a semiconductor substrate 100 and an interlayer dielectric layer 160. The metal gate transistors also include a first metal gate "M1" and a first gate dielectric layer 111 protruding from the first metal gate "M1"; and a second metal gate "M2" and a second gate dielectric layer 112 protruding from the second metal gate "M2". Further, the metal gate transistors include a sidewall spacer 150 around the first metal gate "M1" and the second metal gate "M2", source regions (not shown) and drain regions (not shown). The detailed structures and intermediate structures are described above with respect to the fabrication methods.

Figure 17:
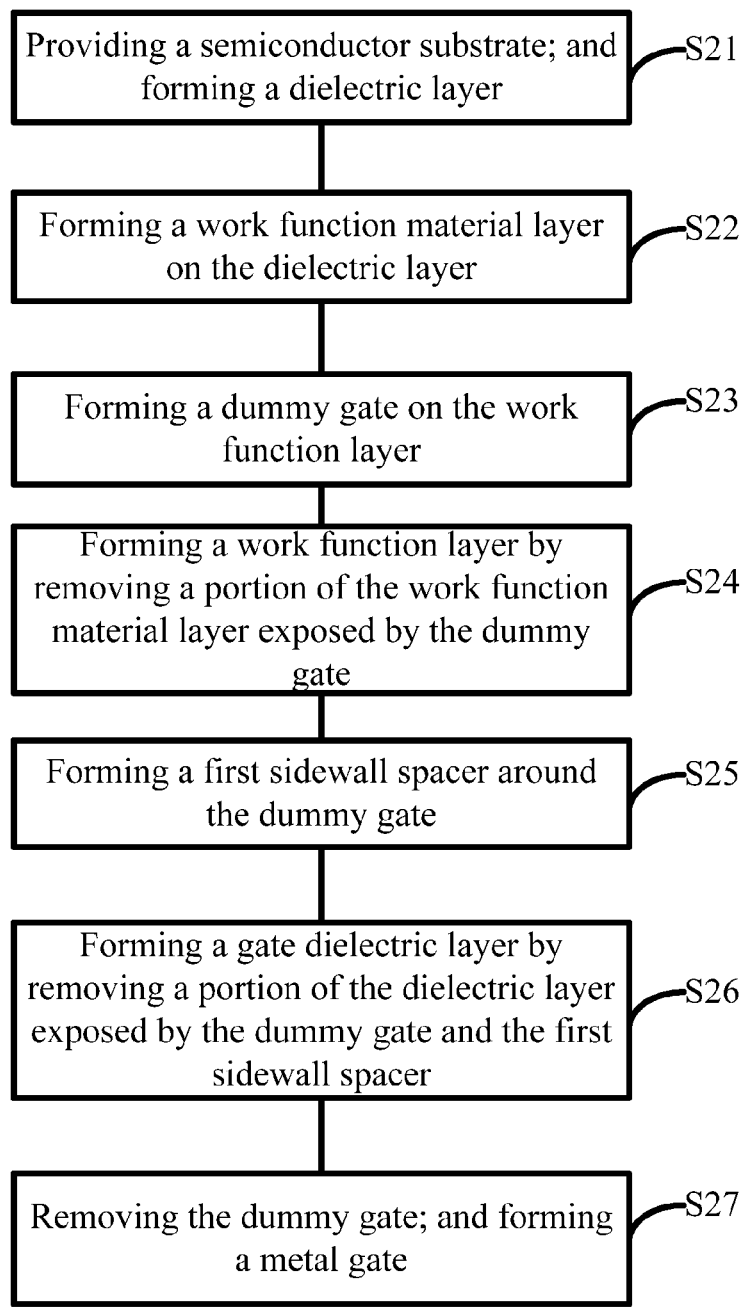
FIG. 17 illustrates another exemplary fabrication process of a metal gate transistor consistent with the disclosed embodiments.

FIG. 17 illustrates another exemplary fabrication process of a metal gate transistor; and FIGS. 18-21 illustrate semiconductor structures corresponding to certain stages of the exemplary fabrication process of a metal gate transistor consistent with the disclosed embodiments.

As shown in FIG. 17, at the beginning of the fabrication process, a semiconductor substrate with certain structures is provided (S21). A corresponding semiconductor structure is illustrated in FIG. 18.

Figure 18:
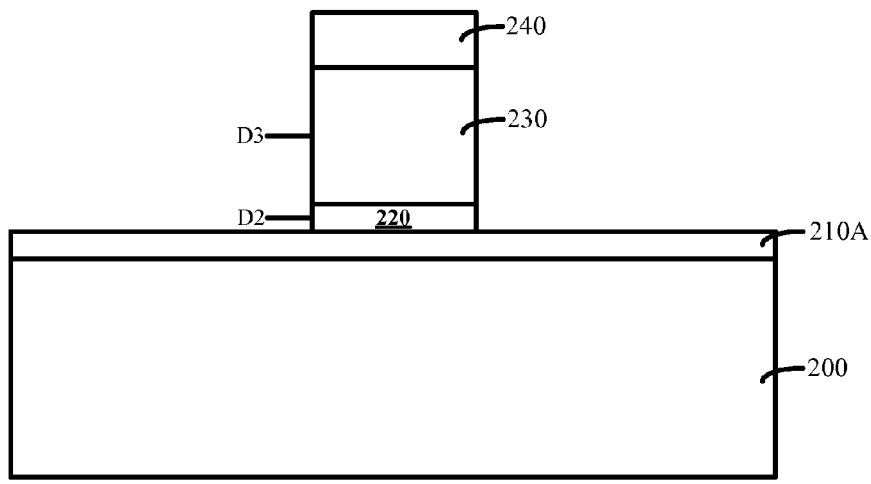
FIGS. 18-21 illustrate semiconductor structures corresponding to certain stages of the exemplary fabrication process of a metal gate transistor consistent with the disclosed embodiments.

As shown in FIG. 18, a semiconductor substrate 200 is provided. The semiconductor substrate 200 may include any appropriate type of semiconductor material, such as single crystal silicon, germanium, poly silicon, amorphous silicon, silicon germanium, carborundum, indium antimonide, lead telluride, indium arsenide, indium phosphide, gallium arsenide, gallium antimonide, alloy semiconductor, or epitaxially grown materials, etc. The semiconductor substrate 200 may also provide a base for subsequent processes and structures.

After providing the semiconductor substrate 200, a dielectric layer 210A may be formed on the semiconductor substrate 200. The dielectric layer 210A may be made of any appropriate material, such as hafnium silicate, zirconium silicate, hafnium dioxide, or zirconium dioxide, etc. These materials may be referred as high dielectric (high-K) materials, thus the dielectric layer 210A may be referred as a high-K dielectric layer. Various processes may be used to form the dielectric layer 210A, such as a chemical vapor deposition (CVD) process, a physical vapor deposition (PVD) process, or an atomic layer deposition (ALD) process, etc.

In certain other embodiments, an interface layer may be formed between the semiconductor substrate 200 and the dielectric layer 210A. The interface layer may be used to compensate interface defects between the semiconductor substrate 200 and the dielectric layer 210A. The interface layer may be made of any appropriate material, such as silicon oxide, silicon nitride, or silicon oxynitride, etc. Various processes may be used to form the interface layer, such as a CVD process, a PVD process, or an ALD process, etc.

Returning to FIG. 17, after providing the semiconductor substrate 200 with the dielectric layer 210A, a work function material layer (not shown) may be formed on the dielectric layer 210A (S22). The work function material layer may be used to subsequently form a work function layer for adjusting the work function of a transistor. Further, a subsequently formed dummy gate may be formed in a different reaction chamber than a chamber for forming the dielectric layer 210A. When the substrate 200 with the dielectric layer 210A is waiting in a queue for forming the dummy gate, it may be easy for the dielectric layer to be exposed in air, thus the dielectric layer 210A may be oxidized, and the quality of the dielectric layer 210A may be affected. If the work function material layer is formed between the dielectric layer 210A and the dummy gate, the work function material layer may be formed in the same chamber for forming the dielectric layer 210A. When the substrate 200 with the dielectric layer 210A and the work function material layer is waiting in queue for forming the dummy gate in another chamber, the work function material layer on the dielectric layer 210A may protect the dielectric layer 210A, and prevent the dielectric layer 210A from being exposed in air.

The work function material layer may be made of any appropriate material, such as ZrO, TaO, HfO, or TiN, etc. Various processes may be used to form the work function material layer, such as a CVD process, a PVD process, or an ALD process, etc.

Returning to FIG. 17, after forming the work function material layer, a dummy gate may be formed on the work function material layer (S23). A corresponding semiconductor is illustrated in FIG. 18.

As shown in FIG. 18, a dummy gate 230 is formed on a subsequently formed work function layer 220. The dummy gate 230 may be used to define the position of a metal gate of a transistor. The dummy gate 230 may be removed in a subsequent process to form a metal gate. In one embodiment, a hard mask layer 240 may be formed on the dummy gate 230.

The dummy gate 120 and the hard mask layer 130 may be formed by sequentially depositing a dummy gate material layer, a hard mask material layer and a photoresist layer; patterning the photoresist layer; and etching the dummy gate material layer and the hard mask material layer using the photoresist layer as an etching mask. After forming the dummy gate 230 and the mask layer 240, the photoresist layer may be removed.

The dummy gate 230 may be made of any appropriate material, such as poly silicon, phosphor-silicate-glass (PSG), or metal materials, etc. In one embodiment, the dummy gate 230 is poly silicon. Various processes may be used to form the dummy gate material layer, such as a CVD process, a PVD process, or an ALD process, etc.

The hard mask layer 240 may be made of any appropriate material, such as silicon oxide, silicon nitride, or silicon oxide nitride, etc. In one embodiment, the hard mask layer 240 is made of silicon nitride. Various processes may be used to form the hard mask material layer, such as a CVD process, a PVD process, or an ALD process, etc.

The hard mask material layer and the dummy gate material layer may be etched by any appropriate process, such as a dry etching process, or a wet etching process, etc. In one embodiment, the hard mask material layer and the dummy gate material layer are etched by a dry etching process.

Returning to FIG. 17, after forming the dummy gate 230 and the hard mask layer 240, a work function layer may be formed (S24). FIG. 18 illustrates a corresponding semiconductor structure.

As shown in FIG. 18, a work function layer 220 is formed between the dummy gate 230 and the dielectric layer 210A. The work function layer 220 may be formed by etching a portion of the work function material layer (not shown) exposed by the dummy gate 230 using the dummy gate 230 and the hard mask layer 240 as an etching mask.

Various etching processes may be used to etch the work function material layer, such as a dry etching process, or a wet etching process, etc. In one embodiment, the work layer 220 may be formed by a dry etching process. A sidewall "D2" of the work function layer 220 may be vertical, i.e., the sidewall "D2" of the work function layer 220 may be vertical to a surface of the semiconductor substrate 200.

Since the work function layer 220 may be formed by the dry etching process using the dummy gate 230 as an etching mask, the sidewall "D2" of the work function layer 220 and a sidewall "D3" of the dummy gate 230 may be on a same plane.

Figure 19:
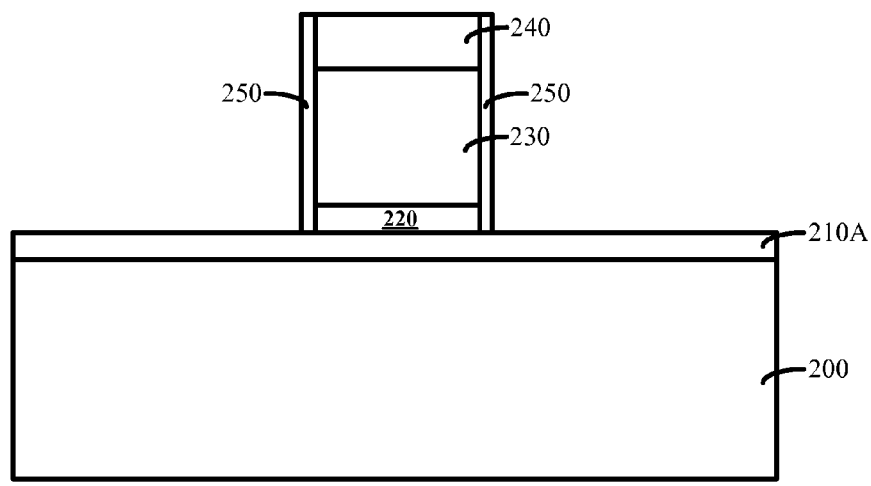

Returning to FIG. 17, after forming the work function layer 220, a first sidewall spacer may be formed around the dummy gate 230 (S25). FIG. 19 illustrates a corresponding semiconductor structure.

As shown in FIG. 19, a first sidewall spacer 250 is formed around the dummy gate 230. In one embodiment, the first sidewall spacer 250 may also cover the side surface of the hard mask layer 240 and the work function layer 220. The first sidewall spacer 250 may be formed by forming a first sidewall spacer material layer on the dielectric layer 210A, the top and side surfaces of the dummy gate 230 and the hard mask layer 130 and the side surface of the work function layer 220, followed by an etch back process. After the etch back process, the first sidewall spacer material layer on the dielectric layer 210A and the top surface of the hard mask layer 240 may be completely removed, the first sidewall spacer 250 is formed around the dummy gate 230, the hard mask layer 240 and the work function layer 220.

The first sidewall spacer material layer may be made of any appropriate material silicon oxide, silicon nitride, or silicon nitride, etc. The first sidewall spacer 250 may also be a stack layer consisting two or more layers of different materials.

Various processes may be used to form the first sidewall spacer material layer, such as a CVD process, a PVD process, an ALD process, or a flowable CVD (FCVD) process, etc.

Various processes may be used to etch the first sidewall spacer material layer, such as a dry etching process, or a wet etching process, etc. In one embodiment, if the first sidewall spacer material layer is silicon oxide, the hard mask layer is silicon nitride, and a dry etching process may be used to form the first sidewall spacer 250. Main gas for the dry etching process may be one or more of $CH_3F$, $CHF_3$, and $CH_2F_2$, etc. Assisting gas for the dry etching process may be one or more of Ar, $O_2$, and He, etc.

Figure 20:
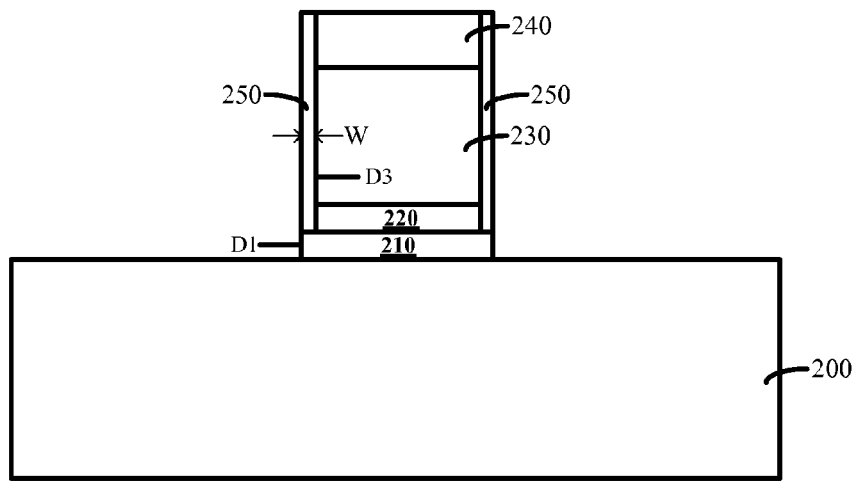

Returning to FIG. 17, after forming the first sidewall spacer 250, a portion of the dielectric layer 210A may be removed to form a gate dielectric layer (S26). FIG. 20 illustrates a corresponding semiconductor structure.

As shown in FIG. 20, a portion of the dielectric layer 210A exposed by the sidewall spacer 250 and the dummy gate 230, i.e., not covered by the sidewall spacer 250 and the dummy gate 230, is removed, and a gate dielectric layer 210 is formed. Various methods may be used to form the gate dielectric layer 210. In one embodiment, the gate dielectric layer 210 is formed by etching the portion of the dielectric layer 210A using the first sidewall spacer 250 and the dummy gate 230 as an etching mask. Various processes may be used to etch and remove the portion of the dielectric layer 210A, such as a dry etching process, or a wet etching process, etc.

Since the gate dielectric layer 210 may be formed by using the dummy gate 230 and the first sidewall spacer 250 around the dummy gate 230 as an etching mask, the sidewall "D1" of the gate dielectric layer 210 may protrude from the sidewall "D3" of the dummy gate 230. A protruding amount "W" of the gate dielectric layer 210, i.e., a distance of the gate dielectric layer 210 protruding from the gate dielectric layer 220, may be equal to the thickness of the first sidewall spacer 250, i.e., a thickness of the first sidewall spacer material layer. Therefore, the protruding amount of the gate dielectric layer 210 may be controlled by the thickness of the first sidewall spacer material layer.

Figure 21:
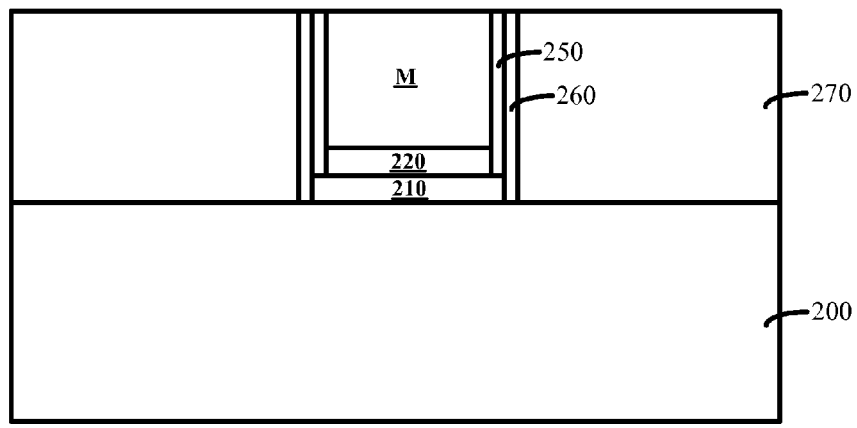

Returning to FIG. 17, after forming the dielectric layer 210, the dummy gate 230 may be removed, and a metal gate may be formed in the position of the dummy gate 230 (S27). FIG. 21 illustrates a corresponding semiconductor structure.

As shown in FIG. 21, the dummy gate 230 and the hard mask layer 240 are removed, a sidewall spacer 260 is formed around the first sidewall spacer 250, an interlayer dielectric layer 270 is formed on the semiconductor substrate 100, and a metal gate "M" is formed at the position of the dummy gate 230. Specifically, a process for forming the metal gate "M" may include forming the sidewall spacer 260 around the first sidewall spacer 250; forming an interlayer dielectric layer 270; performing a planarization on the interlayer dielectric layer 270 by a chemical mechanical polishing (CMP) process and removing the hard mask layer 240 to expose the dummy gate 230; removing the dummy gate 230 to form a trench; filling the trench with a metal material; and polishing extra metal material using a CMP process to forming the metal gate "M" at the position of the dummy gate 230.

The hard mask layer 240 and the dummy gate 230 may be removed by any appropriate process, such as a dry etching process, or a wet etching process, etc. The metal gate "M" may be formed by any appropriate process, such as a PVD process, an FCVD process, or an electroplating process, etc. The metal gate "M" may be made of any appropriate metal, such as Cu, W, Al, gold, or Ti, etc.

Therefore, in the present method, a work function material layer may be formed on the dielectric material layer, and a dummy gate may be formed on the work function material layer, then a portion of the work function material layer exposed by the dummy gate may be removed to form a work function layer, and a first sidewall spacer may be formed around the dummy gate and the work function layer. Further, a portion of the dielectric layer exposed by the dummy gate and the first sidewall spacer may be removed using the dummy gate and the first sidewall spacer as an etching mask to form a gate dielectric layer, and the gate dielectric layer may protrude from a sidewall of the dummy gate. Since a protruding amount of the gate dielectric layer protruding from the dummy gate may be equal to a thickness of the first sidewall spacer, thus the protruding amount of the dielectric layer protruding from the dummy gate may be controlled by adjusting the thickness of the first sidewall spacer.

After forming the metal gate, a source region (not shown) and a drain region (not shown) may be formed in the semiconductor substrate 200 at both sides of the sidewall spacer 250. In certain other embodiments, the source region and the drain region may be formed after forming the gate dielectric layer. Any appropriate process may be used to formed the source region and the drain region.

In certain other embodiments, a plurality of metal gate transistors with different sizes may be formed on a same semiconductor substrate. By forming a first sidewall spacer on around a plurality of dummy gates with different sizes, a plurality of gate dielectric layers with different protruding amounts may be formed in the plurality of metal gate transistors with different sizes.

Thus, a metal gate transistor may be formed by the above disclosed processes and methods. The corresponding metal gate transistor is illustrated in FIG. 21. The metal gate transistor includes a semiconductor substrate 200 and an interlayer dielectric layer 270. The metal gate transistor also includes a metal gate "M" and a gate dielectric layer 210 protruding from the metal gate "M". Further, the metal gate transistor includes a work function layer 220, a first sidewall spacer 250 and a sidewall spacer 260. Further, the metal gate transistor also includes a source region (not shown) and a drain region (not shown). The detailed structures and intermediate structures are described above with respect to the fabrication methods.

Figure 22:
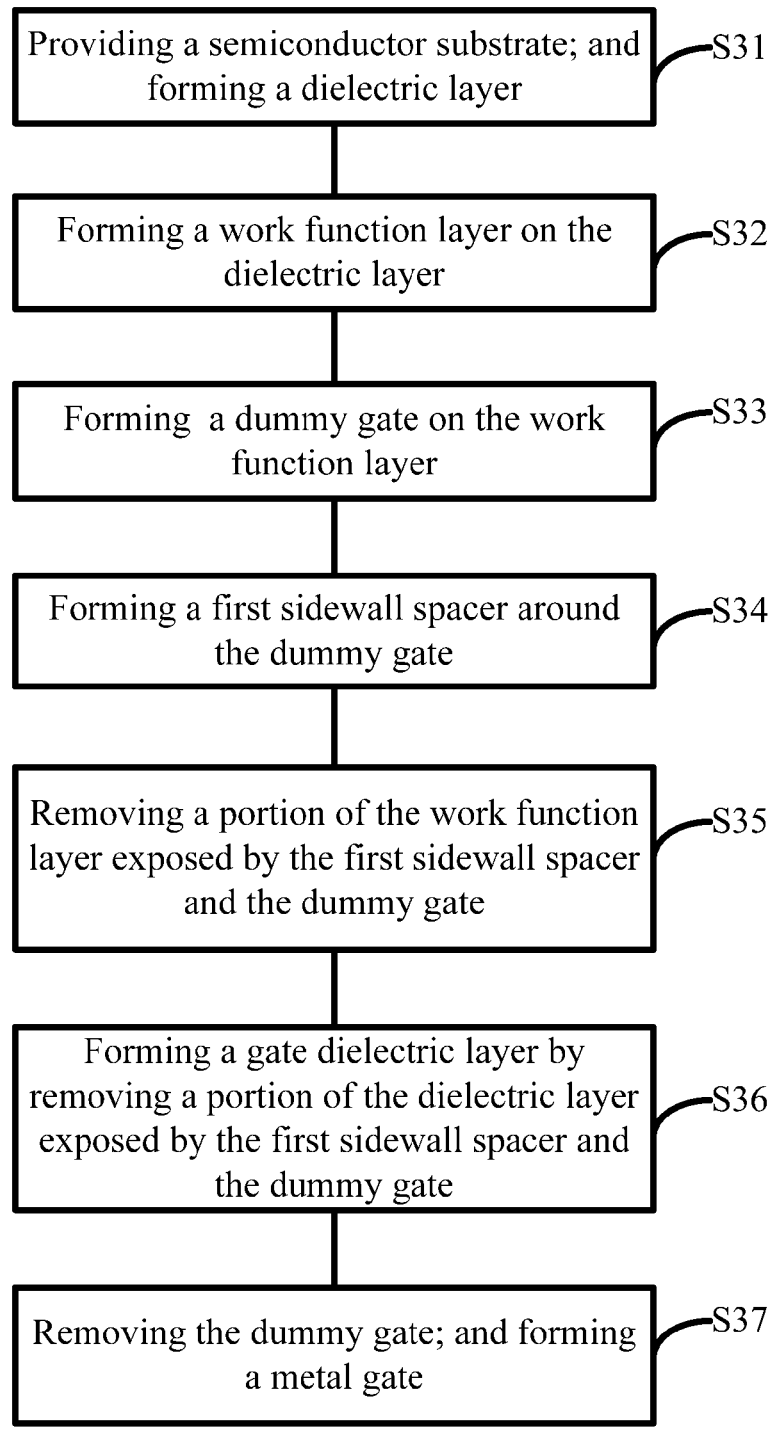
FIG. 22 illustrates another exemplary fabrication process of a metal gate transistor consistent with the disclosed embodiments.

FIG. 22 illustrates another exemplary fabrication process of a metal gate transistor; and FIGS. 23-26 illustrate semiconductor structures corresponding to certain stages of the exemplary fabrication process of a metal gate transistor consistent with the disclosed embodiments.

As shown in FIG. 22, at the beginning of the fabrication process, a semiconductor substrate with certain structures is provided (S31). A corresponding semiconductor device is illustrated in FIG. 23.

Figure 23:
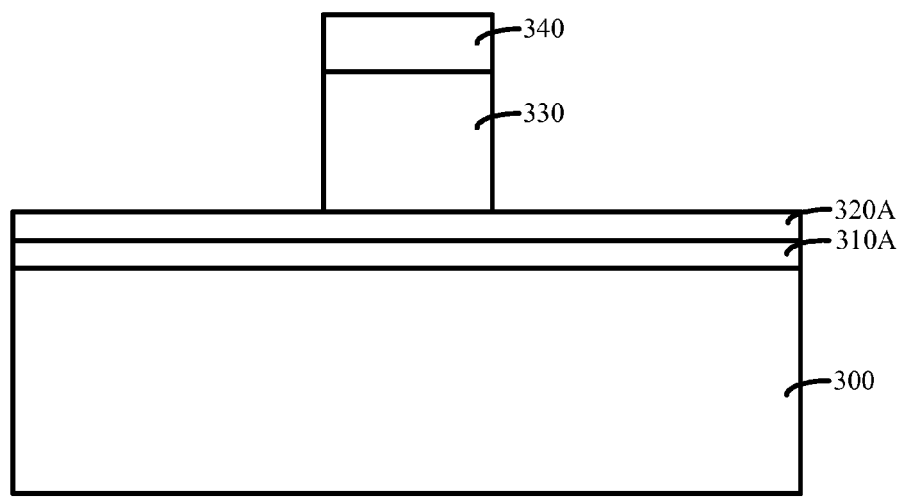
FIGS. 23-26 illustrate semiconductor structures corresponding to certain stages of the exemplary fabrication process of a metal gate transistor consistent with the disclosed embodiments.

As shown in FIG. 23, a semiconductor substrate 300 is provided. The semiconductor substrate 300 may include any appropriate type of semiconductor material, such as single crystal silicon, germanium, poly silicon, amorphous silicon, silicon germanium, carborundum, indium antimonide, lead telluride, indium arsenide, indium phosphide, gallium arsenide, gallium antimonide, alloy semiconductor, or epitaxially grown materials, etc. The semiconductor substrate 300 may also provide a base for subsequent processes and structures.

After providing the semiconductor substrate 300, a dielectric layer 310A may be formed on the semiconductor substrate 300. The dielectric layer 310A may be made of any appropriate material, such as hafnium silicate, zirconium silicate, hafnium dioxide, or zirconium dioxide, etc. These material may be referred as high dielectric (high-K) materials, thus the dielectric layer 310A may be referred as high-K dielectric layer. Various processes may be used to form the dielectric layer 310A, such as a chemical vapor deposition (CVD) process, a physical vapor deposition (PVD) process, or an atomic layer deposition (ALD) process, etc.

In certain other embodiments, an interface layer formed between the semiconductor substrate 300 and the dielectric layer 310A. The interface layer may be used to compensate interface defects between the semiconductor substrate 300 and the dielectric layer 310A. The interface layer may be made of any appropriate material, such as silicon oxide, silicon nitride, or silicon oxynitride, etc. Various processes may be used to form the interface layer, such as a CVD process, a PVD process, or an ALD process, etc.

Returning to FIG. 22, after providing the semiconductor substrate 300 with the dielectric layer 310A, a work function material layer 320A may be formed on the dielectric layer 310A (S32). The work function material layer 320A may be used to subsequently form a work function layer for adjusting the work function of a transistor.

The work function material layer 320A may be made of any appropriate material, such as ZrO, TaO, TiN, or HfO, etc. Various processes may be used to form the work function material layer, such as a CVD process, a PVD process, or an ALD process, etc.

Returning to FIG. 22, after forming the work function material layer, a dummy gate may be formed on the work function material layer 320A (S33). A corresponding semiconductor is illustrated in FIG. 23.

As shown in FIG. 23, a dummy gate 330 is formed on the work function material layer 320A. The dummy gate 330 may be used to define the position of a metal gate of a transistor. The dummy gate 330 may be removed in a subsequent process to form the metal gate. In one embodiment, a hard mask layer 340 may be formed on the dummy gate 330.

The dummy gate 330 and the hard mask layer 340 may be formed by sequentially depositing a dummy gate material layer, a hard mask material layer and a photoresist layer; patterning the photoresist layer; and etching the dummy gate material layer and the hard mask material layer using the photoresist layer as an etching mask. After forming the dummy gate 330 and the mask layer 340, the photoresist layer may be removed.

The dummy gate 330 may be made of any appropriate material, such as poly silicon, phosphor-silicate-glass (PSG), or metal materials, etc. In one embodiment, the dummy gate 330 is poly silicon. Various processes may be used to form the dummy gate material layer, such as a CVD process, a PVD process, or an ALD process, etc.

The hard mask layer 340 may be made of any appropriate material, such as silicon oxide, silicon nitride, or silicon oxide nitride, etc. In one embodiment, the hard mask layer 340 is made of silicon nitride. Various processes may be used to form the hard mask material layer, such as a CVD process, a PVD process, or an ALD process, etc.

The hard mask material layer and the dummy gate material layer may be etched by any appropriate process, such as a dry etching process, or a wet etching process, etc. In one embodiment, the hard mask material layer and the dummy gate material layer are etched by a dry etching process.

Figure 24:
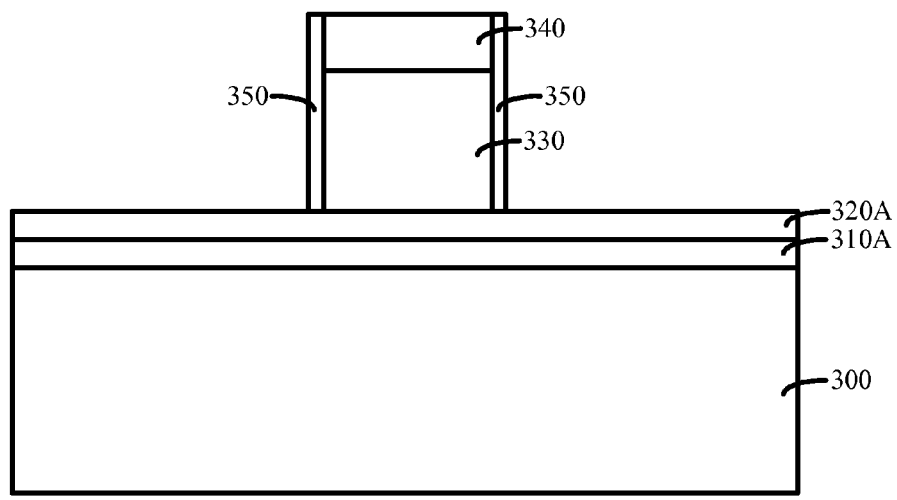

Returning to FIG. 22, after forming the dummy gate 330 and the hard mask layer 340, a first sidewall spacer may be formed around the dummy gate 230 (S34). FIG. 24 illustrates a corresponding semiconductor structure.

As shown in FIG. 24, a first sidewall spacer 350 is formed around the dummy gate 330. In one embodiment, the first sidewall spacer 350 may also cover the side surface of the hard mask layer 340. The first sidewall spacer 350 may be formed by forming a first sidewall spacer material layer on the work function material layer 320A, the side surfaces of the dummy gate 330 and the hard mask layer 340, followed by an etch back process. After the etch back process, the first sidewall spacer material layer on the work function material layer 320A and the top surface of the hard mask layer 340 may be completely removed, the first sidewall spacer 350 is formed around the dummy gate 330 and the hard mask layer 340.

The first sidewall spacer material layer may be made of any appropriate material silicon oxide, silicon nitride, or silicon nitride, etc. The first sidewall spacer 350 may also be a stack layer consisting two or more layers of different material.

Various processes may be used to form the first sidewall spacer material layer, such as a CVD process, a PVD process, an ALD process, or a flowable CVD (FCVD) process, etc.

Various processes may be used to etch the first sidewall spacer material layer, such as a dry etching process, or a wet etching process, etc. In one embodiment, if the first sidewall spacer material layer is silicon oxide, the hard mask layer is silicon nitride, and the work function material layer is made of TiN, a dry etching process may be used to form the first sidewall spacer 350. Main gas for the dry etching process may be one or more of $CH_3F$, $CHF_3$, and $CH_2F_2$, etc. Assisting gas for the dry etching process may be one or more of Ar, $O_2$, and He, etc.

Returning to FIG. 22, after forming the first sidewall spacer 350, a work function layer may be formed (S35). A corresponding semiconductor structure is illustrated in FIG. 25.

Figure 25:
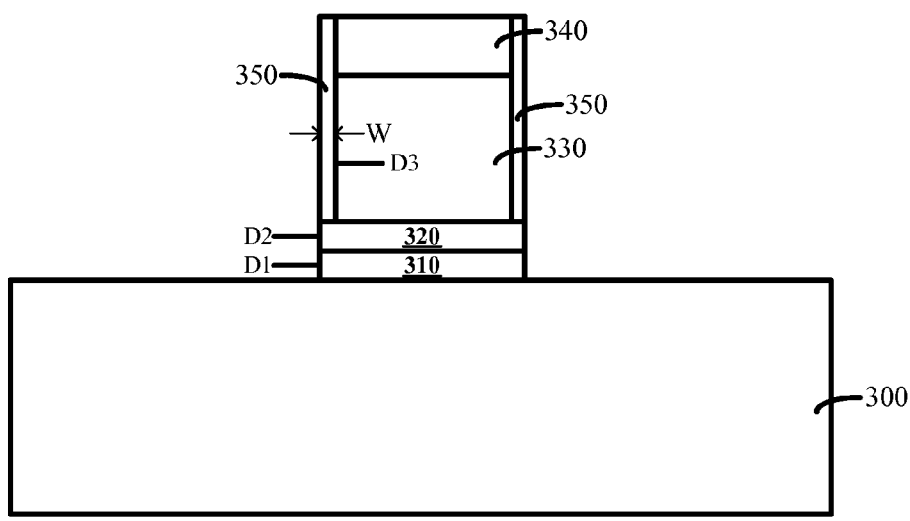

As shown in FIG. 25, a work function layer 320 is formed between the dummy gate 330 and a subsequently formed gate dielectric layer 310. The work function layer 320 may be formed by etching a portion of the work function material layer 320A exposed by the dummy gate 330 and the first sidewall spacer 350 using the dummy gate 330 and the first sidewall spacer 350 as an etching mask.

Various etching processes may be used to etch the work function material layer, such as a dry etching process, or a wet etching process, etc. In one embodiment, the work function layer 320 may be formed by a dry etching process. A sidewall "D2" of the work function layer 320 may be vertical, i.e., the sidewall "D2" of the work function layer 320 may be vertical to a surface of the semiconductor substrate 300.

Since the work function layer 320 may formed by the dry etching process using the dummy gate 330 and the first sidewall spacer 350 as an etching mask, the sidewall "D2" of the work function layer 320 may protrude from a sidewall "D3" of the dummy gate 330. Further, a protruding amount "W" of the sidewall "D2" of the work function layer 320, i.e., a size of the sidewall wall "D2" of the work function layer 320 protruding from the sidewall "D3" of the dummy gate 330, may be equal to a thickness of the first sidewall spacer 350, i.e., a thickness of the first sidewall spacer material. Thus, the protruding amount "W" of the work function layer 320 may be controlled by adjusting the thickness of the first sidewall spacer 350.

Further, the first sidewall spacer 350 may be formed around the dummy gate 330, and the sidewall "D2" of the work function layer 320 may be made to protrude from the sidewall "D3" of the dummy gate 330 by etching the work function material layer 320A using the dummy gate 330 and the first sidewall spacer 350 as an etching mask, it may unnecessarily need complex processes to cause the sidewall "D2" of the work function layer 320 to protrude from the sidewall "D3" of the dummy gate 330. Thus, it may be easy to cause the sidewall "D2" of the work function layer 320 to protrude from the sidewall "D3" of the dummy gate 330.

Returning to FIG. 22, after forming the work function layer 320, a portion of the dielectric layer 310A may be removed to form a gate dielectric layer (S36). FIG. 25 illustrates a corresponding semiconductor structure.

As shown in FIG. 25, a portion of the dielectric layer 310A exposed by the first sidewall spacer 350 and the dummy gate 330, i.e., not covered by the sidewall spacer 350 and the dummy gate 330, is removed, and a gate dielectric layer 310 is formed between the work function layer 320 and the surface of the semiconductor substrate 300. Various methods may be used to form the gate dielectric layer 310. In one embodiment, the gate dielectric layer 310 is formed by etching the portion of the dielectric layer 310A using the first sidewall spacer 350 and the dummy gate 330 as an etching mask. Various processes may be used to etch and remove the portion of the dielectric layer 310A, such as a dry etching process, or a wet etching process, etc.

Since the gate dielectric layer 310 may be formed by using the dummy gate 330 and the first sidewall spacer 350 around the dummy gate 330 as an etching mask, the sidewall "D1" of the gate dielectric layer 310 may protrude from the sidewall "D3" of the dummy gate 330. A protruding amount "W" of the gate dielectric layer 310, i.e., a distance of the sidewall "D1" of the gate dielectric layer 310 protruding from the sidewall "D3" of the dummy gate 330, may be also equal to the thickness of the first sidewall spacer 350, i.e., a thickness of the first sidewall spacer material layer. Therefore, the protruding amount "W" of the gate dielectric layer 310 and the work function layer 320 may be controlled by the thickness of the first sidewall spacer material layer simultaneously.

Figure 26:
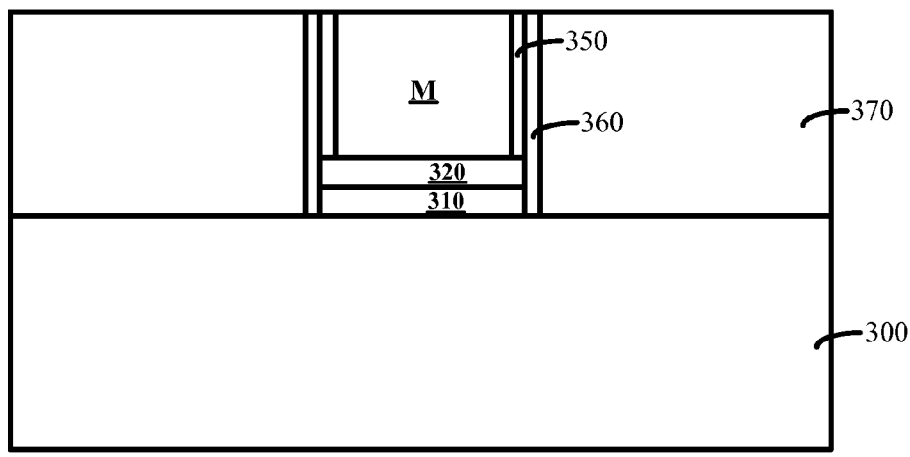

Returning to FIG. 22, after forming the dielectric layer 310, the dummy gate 330 may be removed, and a metal gate may be formed at the position of the dummy gate 330 (S37). FIG. 26 illustrates a corresponding semiconductor structure.

As shown in FIG. 26, the dummy gate 330 and the hard mask layer 340 are removed, a sidewall spacer 360 is formed around the first sidewall spacer 350, an interlayer dielectric layer 370 is formed on the semiconductor substrate 300, and a metal gate "M" is formed at the position of the dummy gate 330. Specifically, a process for forming the metal gate "M" may include forming the sidewall spacer 360 around the first sidewall spacer 350; forming an interlayer dielectric layer 370; performing a planarization on the interlayer dielectric layer 370 by a chemical mechanical polishing (CMP) process and removing the hard mask layer 340 to expose the dummy gate 330; removing the dummy gate 330 to form a trench; filling the trench with a metal material; and polishing extra metal material using a CMP process to forming the metal gate "M" in the position of the dummy gate 330.

The hard mask layer 340 and the dummy gate 330 may be removed by any appropriate process, such as a dry etching process, or a wet etching process, etc. The metal gate "M" may be formed by any appropriate process, such as a PVD process, an FCVD process, or an electroplating process, etc. The metal gate "M" may be made of any appropriate metal, such as Cu, W, Al, gold, or Ti, etc.

As mentioned early, there may be a few high temperature processes after forming a work function layer. The high temperature processes may cause the work function layer and the gate dielectric layer to shrink. A width of the gate dielectric layer and the work function layer may be smaller than a width of the dummy gate. A length of the gate dielectric layer and the work function layer may be smaller than a length of the dummy gate as well. Thus, after removing the dummy gate and forming a metal gate, a width of the metal gate may be greater than the width of the gate dielectric layer and the work function layer, and a length of the metal gate may be greater than the length of the gate dielectric and the work function layer as well.

In one embodiment, the sidewall "D2" of the work function layer 320 may protrude from the sidewall "D3" of the dummy gate 330, thus the shrinkage of the gate dielectric layer 320 caused by subsequent processes may be compensated by the protruding amount "W" of the work function layer 320. By controlling the protruding amount "W" of the work function layer 320, the width of the work function layer 320 after shrinking may still not smaller than the width of the metal gate "M". That is, after the work function layer 320 shrinks, the sidewall "D2" of the work function layer 320 may still protrude from the sidewall of the metal gate "M", and/or the sidewall "D3" of the work function layer 320 and the sidewall of the metal gate "M" may be on a same plane. Thus, it may prevent the width of the metal gate "M" from being greater than the width of the work function layer 320.

Further, the length of the work function layer 320 after shrinking may not be smaller than the length of the metal gate "M". That is, after the work function layer 320 shrinks, the sidewall "D3" of the work function layer 320 may still protrude from the sidewall of the metal gate "M", and/or the sidewall "D3" of the work function layer 320 and the sidewall of the metal gate "M" may be on a same plane. Thus, it may prevent the length of the metal gate "M" from being greater than the length of the work function layer 320, the performance of the transistor may be improved.

After forming the metal gate "M", a source region (not shown) and a drain region (not shown) may be formed in the semiconductor substrate 200 at both sides of the sidewall spacer 360. In certain other embodiments, the source region and the drain region may be formed after forming the gate dielectric layer. Any appropriate process may be used to form the source region and the drain region.

In certain other embodiments, a plurality of metal gate transistors with different sizes may be formed on a same semiconductor substrate. By forming a first sidewall spacer around a plurality of dummy gates with different sizes, a plurality of gate dielectric layers and work function layers with different protruding amounts may be formed in the plurality of metal gate transistors with different sizes.

Thus, a metal gate transistor may be formed by the above disclosed processes and methods. The corresponding metal gate transistor is illustrated in FIG. 26. The metal gate transistor includes a semiconductor substrate 300 and an interlayer dielectric layer 370. The metal gate transistor also includes a metal gate "M", and a gate dielectric layer 310 protruding from the metal gate "M". Further, the metal gate transistor includes a work function layer 320 protruding from the metal gate "M", a first sidewall spacer 350 and a sidewall spacer 360. Further, the metal gate transistor also includes a source region (not shown) and a drain region (not shown). The detailed structures and intermediate structures are described above with respect to the fabrication methods.

Figure 27:
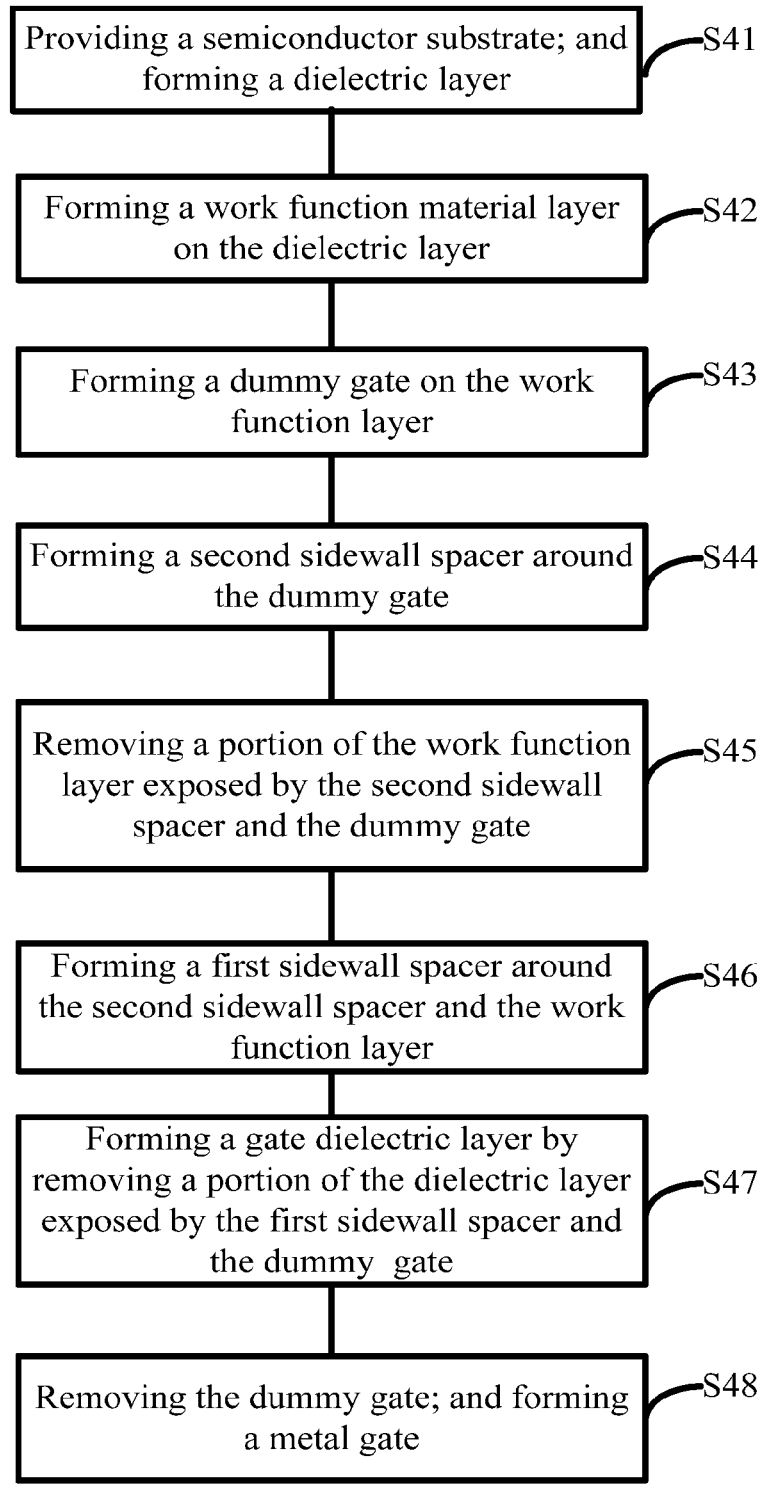
FIG. 27 illustrates another exemplary fabrication process of a metal gate transistor consistent with the disclosed embodiments.

FIG. 27 illustrates another exemplary fabrication process of a metal gate transistor; and FIGS. 28-31 illustrate semiconductor structures corresponding to certain stages of the exemplary fabrication process of a metal gate transistor consistent with the disclosed embodiments.

Figure 28:
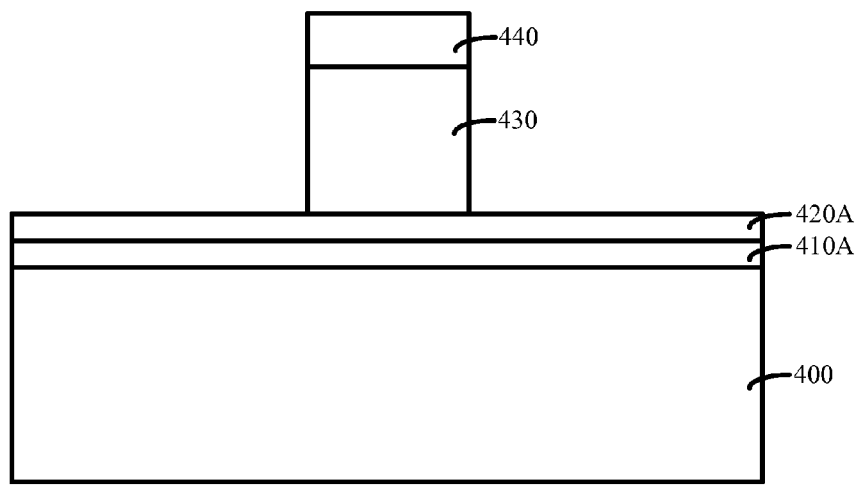
FIGS. 28-31 illustrate semiconductor structures corresponding to certain stages of the exemplary fabrication process of a metal gate transistor consistent with the disclosed embodiments.

As shown in FIG. 27, at the beginning of the fabrication process, a semiconductor substrate with certain structures is provided (S41). A corresponding semiconductor device is illustrated in FIG. 28.

As shown in FIG. 23, a semiconductor substrate 400 is provided. The semiconductor substrate 400 may include any appropriate type of semiconductor material, such as single crystal silicon, germanium, poly silicon, amorphous silicon, silicon germanium, carborundum, indium antimonide, lead telluride, indium arsenide, indium phosphide, gallium arsenide, gallium antimonide, alloy semiconductor, or epitaxially grown materials, etc. The semiconductor substrate 400 may also provide a base for subsequent processes and structures.

After providing the semiconductor substrate 400, a dielectric layer 410A may be formed on the semiconductor substrate 400. The dielectric layer 410A may be made of any appropriate material, such as hafnium silicate, zirconium silicate, hafnium dioxide, or zirconium dioxide, etc. These materials may be referred as high dielectric (high-K) materials, thus the dielectric layer 410A may be referred to as a high-K dielectric layer. Various processes may be used to form the dielectric layer 410A, such as a chemical vapor deposition (CVD) process, a physical vapor deposition (PVD) process, or an atomic layer deposition (ALD) process, etc.

In certain other embodiments, an interface layer formed between the semiconductor substrate 400 and the dielectric layer 410A. The interface layer may be used to compensate interface defects between the semiconductor substrate 400 and the dielectric layer 410A. The interface layer may be made of any appropriate material, such as silicon oxide, silicon nitride, or silicon oxynitride, etc. Various processes may be used to form the interface layer, such as a CVD process, a PVD process, or an ALD process, etc.

Returning to FIG. 27, after providing the semiconductor substrate 400 with the dielectric layer 410A, a work function material layer may be formed on the dielectric layer 210A (S42). A corresponding semiconductor structure is illustrated in FIG. 28.

As shown in 28, a work function material layer 420A is formed on the dielectric layer 410A. The work function material layer 420A may be used to subsequently form a work function layer for adjusting the work function of a transistor.

The work function material layer 420A may be made of any appropriate material, such as ZrO, TaO, TiN, or HfO, etc. Various processes may be used to form the work function material layer 420A, such as a CVD process, a PVD process, or an ALD process, etc.

Returning to FIG. 27, after forming the work function material layer 420A, a dummy gate may be formed on the work function material layer 420A (S43). A corresponding semiconductor is shown in FIG. 28.

As shown in FIG. 28, a dummy gate 430 is formed on the work function material layer 420A. The dummy gate 430 may be used to define the position of a metal gate of a transistor. The dummy gate 430 may be removed in a subsequent process to form the metal gate. In one embodiment, a hard mask layer 440 may be formed on the dummy gate 430.

The dummy gate 430 and the hard mask layer 440 may be formed by sequentially depositing a dummy gate material layer, a hard mask material layer and a photoresist layer; patterning the photoresist layer; and etching the dummy gate material layer and the hard mask material layer using the photoresist layer as an etching mask. After forming the dummy gate 430 and the mask layer 440, the photoresist layer may be removed.

The dummy gate 430 may be made of any appropriate material, such as poly silicon, phosphor-silicate-glass (PSG), or metal materials, etc. In one embodiment, the dummy gate 430 is poly silicon. Various processes may be used to form the dummy gate material layer, such as a CVD process, a PVD process, or an ALD process, etc.

The hard mask layer 440 may be made of any appropriate material, such as silicon oxide, silicon nitride, or silicon oxide nitride, etc. In one embodiment, the hard mask layer 440 is made of silicon nitride. Various processes may be used to form the hard mask material layer, such as a CVD process, a PVD process, or an ALD process, etc.

The hard mask material layer and the dummy gate material layer may be etched by any appropriate process, such as a dry etching process, or a wet etching process, etc. In one embodiment, the hard mask material layer and the dummy gate material layer are etched by a dry etching process.

Figure 29:
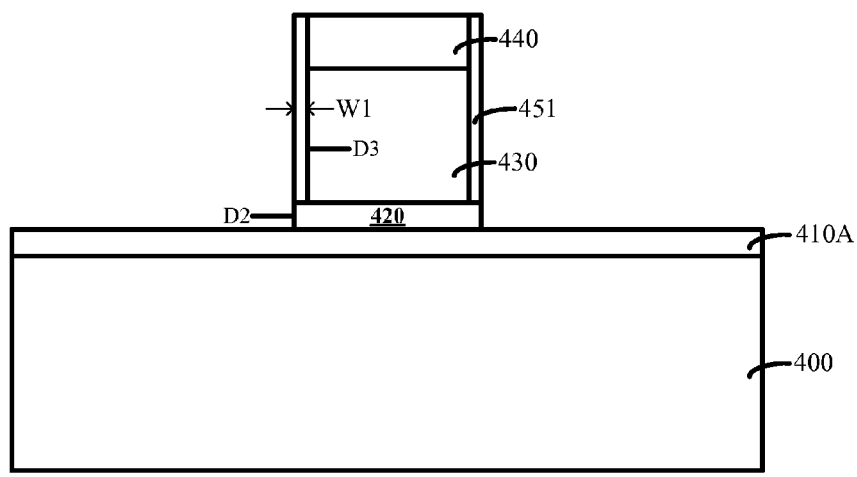

Returning to FIG. 27, after forming the dummy gate 430 and the hard mask layer 440, a second sidewall spacer may be formed around the dummy gate 430 (S44). FIG. 29 illustrates a corresponding semiconductor structure.

As shown in FIG. 29, a second sidewall spacer 451 is formed around the dummy gate 430. In one embodiment, the second sidewall spacer 451 may also cover the side surface of the hard mask layer 440. The second sidewall spacer 451 may be formed by forming a second sidewall spacer material layer on the work function material layer 420A, the side surfaces of the dummy gate 430 and the hard mask layer 440, followed by an etch back process. After the etch back process, the second sidewall spacer material layer on the work function material layer 420A and the top surface of the hard mask layer 440 may be completely removed, the second sidewall spacer 451 is formed around the dummy gate 430 and the hard mask layer 440.

The second sidewall spacer material layer may be made of any appropriate material silicon oxide, silicon nitride, or silicon nitride, etc. The second sidewall spacer 451 may also be a stack layer consisting two or more layers of different material.

Various processes may be used to form the second sidewall spacer material layer, such as a CVD process, a PVD process, an ALD process, or an FCVD process, etc.

Various processes may be used to etch the second sidewall spacer material layer, such as a dry etching process, or a wet etching process, etc. In one embodiment, if the second sidewall spacer material layer is silicon oxide, the hard mask layer 440 is silicon nitride, and the work function material layer 420A is TiN, a dry etching process may be used to form the second sidewall spacer 451. The dry etching process may have a relatively high selective etching ratio to the second sidewall spacer material layer and the work function material layer 420A. In one embodiment, main gas for the dry etching process may be one or more of $CH_3F$, $CHF_3$, and $CH_2F_2$, etc. Assisting gas for the dry etching process may be one or more of Ar, $O_2$, and He, etc.

Returning to FIG. 27, after forming the second sidewall spacer 451, a work function layer may be formed (S45). A corresponding semiconductor structure is illustrated in FIG. 29.

As shown in FIG. 29, a work function layer 420 is formed between the dummy gate 430 and the dielectric layer 410A. The work function layer 420 may be formed by etching a portion of the work function material layer 420A exposed by the dummy gate 430 and the second sidewall spacer 451 using the dummy gate 430 and the second sidewall spacer 451 as an etching mask.

Various etching processes may be used to etch the work function material layer 420A, such as a dry etching process, or a wet etching process, etc. In one embodiment, the work function layer 420 may be formed by a dry etching process. A sidewall "D2" of the work function layer 420 may be vertical, i.e., the sidewall "D2" of the work function layer 420 may be vertical to a surface of the semiconductor substrate 400.

Since the work function layer 420 may formed by the dry etching process using the dummy gate 430 and the second sidewall spacer 451 as an etching mask, the sidewall "D2" of the work function layer 420 may protrude from a sidewall "D3" of the dummy gate 430. Further, a protruding amount "W1" of the sidewall "D2" of the work function layer 420, i.e., a size of the sidewall wall "D2" of the work function layer 420 protruding from the sidewall "D3" of the dummy gate 430, may be equal to a thickness of the second sidewall spacer 451, i.e., a thickness of the second sidewall spacer material layer. Thus, the protruding amount "W1" of the work function layer 420 may be controlled by adjusting the thickness of the second sidewall spacer 451.

Returning to FIG. 27, after forming the work function layer 420, a first sidewall spacer may be formed around the second sidewall spacer 451 (S46). A corresponding semiconductor is shown in FIG. 30.

Figure 30:
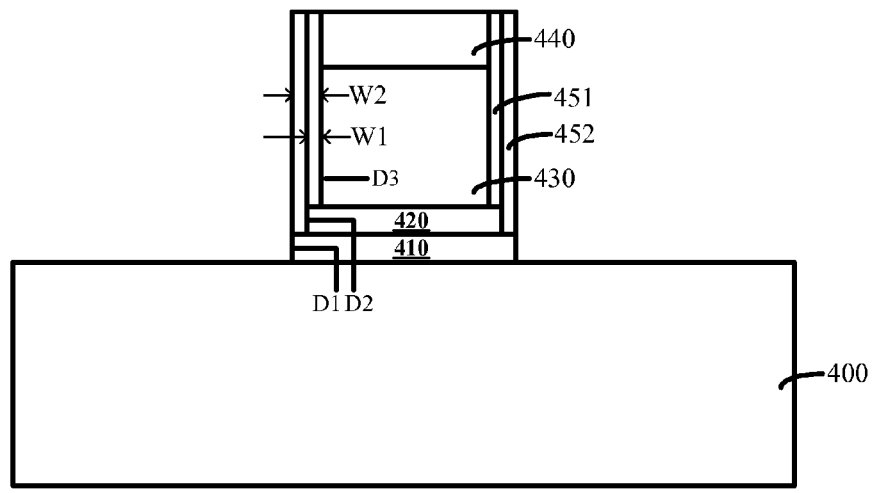

As shown in FIG. 30, a first sidewall spacer 452 is formed around the second sidewall spacer 451 and the work function layer 420. The first sidewall spacer 452 may be formed by forming a first sidewall spacer material layer on the dielectric layer 410A, the side surfaces of second sidewall spacer 451 and the work function layer 420 and the top surface of the hard mask layer 440, followed by an etch back process. After the etch back process, the first sidewall spacer material layer on the dielectric layer layer 410A and the top surface of the hard mask layer 440 may be completely removed, the first sidewall spacer 452 is formed around the second sidewall spacer 451 and the work function layer 420.

The first sidewall spacer material layer may be made of any appropriate material silicon oxide, silicon nitride, or silicon nitride, etc. The first sidewall spacer 452 may also be a stack layer consisting two or more layers of different material.

Various processes may be used to form the first sidewall spacer material layer, such as a CVD process, a PVD process, an ALD process, or an FCVD process, etc.

Various processes may be used to etch the first sidewall spacer material layer, such as a dry etching process, or a wet etching process, etc. In one embodiment, if the first sidewall spacer material layer is silicon oxide; and the hard mask layer is silicon nitride, a dry etching process may be used to form the first sidewall spacer 452. The dry etching process may have a relatively high selective etching ratio to the first sidewall spacer material layer and the dielectric layer 410A. In one embodiment, main gas for the dry etching process may be one or more of $CH_3F$, $CHF_3$, and $CH_2F_2$, etc. Assisting gas for the dry etching process may be one or more of Ar, $O_2$, and He, etc.

Returning to FIG. 27, after forming the first sidewall spacer 452, a portion of the dielectric layer 410A may be removed to form a gate dielectric layer (S47). FIG. 30 illustrates a corresponding semiconductor structure.

As shown in FIG. 30, a portion of the dielectric layer 410A exposed by the second sidewall spacer 452 and the dummy gate 430, i.e., not covered by the first sidewall spacer 452 and the dummy gate 430, is removed, and a gate dielectric layer 410 is formed between the work function layer 420 and the surface of the semiconductor substrate 400. Various methods may be used to form the gate dielectric layer 410. In one embodiment, the gate dielectric layer 410 is formed by etching the portion of the dielectric layer 410A using the first sidewall spacer 451 and the dummy gate 430 as an etching mask. Various processes may be used to etch and remove the portion of the dielectric layer 410A, such as a dry etching process, or a wet etching process, etc.

Since the gate dielectric layer 410 may be formed by using the dummy gate 430 and the first sidewall spacer 452 around the second sidewall spacer 451 as an etching mask, the sidewall "D1" of the gate dielectric layer 410 may protrude from the sidewall "D3" of the dummy gate 430. A protruding amount "W2" of the gate dielectric layer 310, i.e., a distance of the sidewall "D1" of the gate dielectric layer 410 protruding from the sidewall "D3" of the dummy gate 430, may be equal to a total thickness of the first sidewall spacer 452 and the second sidewall spacer 451. Therefore, the protruding amount "W2" of the gate dielectric layer 410 may be controlled by the total thickness of the first sidewall spacer 452 and the second sidewall spacer 451.

Further, the protruding amount "W1" of the work function layer 420 may be equal to the thickness of the second sidewall spacer 451, and the protruding amount "W2" of the gate dielectric layer 410 may be equal to the total thickness of the first sidewall spacer 452 and the second sidewall spacer 451, thus the protruding amount "W2" of the gate dielectric layer 410 may be greater than the protruding amount "W1" of the work function layer 420.

Figure 31:
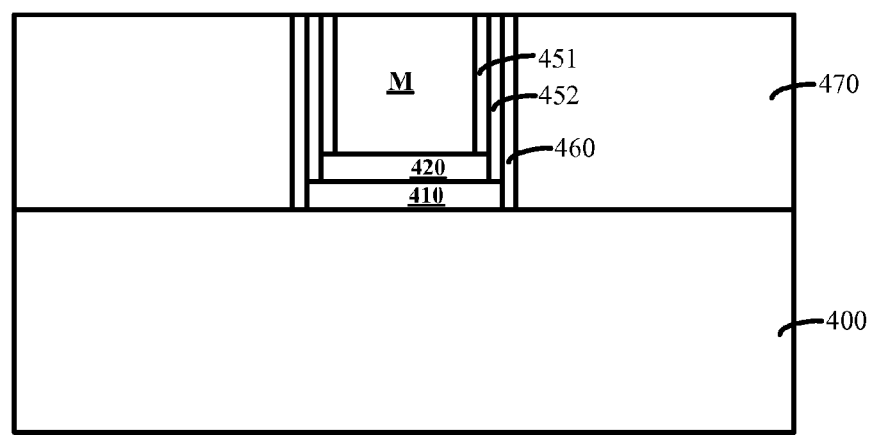

Returning to FIG. 27, after forming the dielectric layer 410, the dummy gate 430 may be removed, and a metal gate may be formed at the position of the dummy gate 430 (S37). FIG. 31 illustrates a corresponding semiconductor structure.

As shown in FIG. 31, the dummy gate 430 and the hard mask layer 440 are removed, a sidewall spacer 460 is formed around the first sidewall spacer 452, an interlayer dielectric layer 470 is formed on the semiconductor substrate 400, and a metal gate "M" is formed at the position of the dummy gate 430. Specifically, a process for forming the metal gate "M" may include: forming the sidewall spacer 460 around the first sidewall spacer 452; forming an interlayer dielectric layer 470; performing a planarization on the interlayer dielectric layer 470 by a chemical mechanical polishing (CMP) process and removing the hard mask layer 440 to expose the dummy gate 430; removing the dummy gate 430 to form a trench; filling the trench with a metal material; and polishing extra metal material using a CMP process to forming the metal gate "M" in the position of the dummy gate 430.

The hard mask layer 440 and the dummy gate 430 may be removed by any appropriate process, such as a dry etching process, or a wet etching process, etc. The metal gate "M" may be formed by any appropriate process, such as a PVD process, an FCVD process, or an electroplating process, etc. The metal gate "M" may be made of any appropriate metal, such as Cu, W, Al, gold, or Ti, etc.

After forming the metal gate "M", a source region (not shown) and a drain region (not shown) may be formed in the semiconductor substrate 400 at both sides of the sidewall spacer 460. In certain other embodiments, the source region and the drain region may be formed after forming the gate dielectric layer. Any appropriate process may be used to formed the source region and the drain region.

In certain other embodiments, a plurality of metal gate transistors with different sizes may be formed on a same semiconductor substrate. By forming a second sidewall spacer around a plurality of dummy gates with different sizes and a first sidewall spacer a around a plurality of work function layer with different sizes, work function layers and the gate dielectric layers with different protruding amounts may be formed in the plurality of metal gate transistors with different sizes.

In one embodiment, the longer of the length of the transistor and the smaller of the width of the transistor are, the larger of the protruding amount of the sidewalls of the gage dielectric layer and/or work function layer are.

Thus, a metal gate transistor may be formed by the above disclosed processes and methods. The corresponding metal gate transistor is illustrated in FIG. 31. The metal gate transistor includes a semiconductor substrate 400 and an interlayer dielectric layer 470. The metal gate transistor also includes a metal gate "M", and a gate dielectric layer 410 protruding from the metal gate "M". Further, the metal gate transistor includes a work function layer 420 protruding from the metal gate "M", a first sidewall spacer 452, a second sidewall spacer 451 and a sidewall spacer 460. Further, the metal gate transistor also includes a source region (not shown) and a drain region (not shown). The detailed structures and intermediate structures are described above with respect to the fabrication methods.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a metal gate transistor, comprising:
   providing a semiconductor substrate;
   forming a dielectric layer on the semiconductor substrate;
   forming at least one dummy gate on the dielectric layer;
   forming a first sidewall spacer around the dummy gate;
   forming a gate dielectric layer with sidewalls protruding from sidewalls of the dummy gate by etching the dielectric layer using the first sidewall spacer and the dummy gate as an etching mask;
   removing the dummy gate to form a trench; and
   forming a metal gate in the trench,
   wherein:
   the sidewalls of the gate dielectric layer are vertical sidewalls and perpendicular to the semiconductor substrate.

2. The method according to claim 1, before forming the dummy gate, further including:
   forming a work function layer protruding from the dummy gate on the dielectric layer.

3. The method according to claim 1, after forming the metal gate, further including:
   forming a source region and a drain region in the semiconductor substrate at both sides of the first sidewall spacer.

4. The method according to claim 1, wherein forming the gate dielectric layer further includes:
   etching a portion of the dielectric layer exposed by the first sidewall spacer and the dummy gate using the first sidewall spacer and the dummy gate as an etching mask.

5. The method according to claim 1, wherein forming the first sidewall spacer further includes:
   forming a second sidewall spacer around the dummy gate;
   forming the first sidewall spacer around the second sidewall spacer and sidewalls of a work function layer.

6. The method according to claim 1, after forming the dummy gate, further including:
   forming a hard mask layer.

7. The method according to claim 1, wherein forming the first sidewall spacer further includes:
   forming a first sidewall spacer material layer on the dielectric layer and sidewalls and top of the dummy gate; and
   performing an etch back process to remove the first sidewall spacer material layer on the dielectric layer and the top of the dummy gate.

8. The method according to claim 1, wherein:
   the dummy gate includes a first dummy gate and a second dummy gate.

9. The method according to claim 1, wherein:
   the first sidewall spacer is made of silicon oxide.

10. The method according to claim 2, wherein forming the work function layer further includes:
    forming a work function material layer; and etching the work function material layer using the first sidewall spacer as an etching mask.

11. The method according to claim 7, wherein:
the first sidewall spacer material layer is formed by an atomic layer deposition process; and
thickness of the first sidewall spacer material layer is in a range of approximately 1 Å~50 Å.

12. The method according to claim 10, wherein:
the work function layer is made of TiN.

13. The method according to claim 10, wherein:
the first sidewall spacer covers sidewalls of the work function layer.

* * * * *